(12) United States Patent
Harding

(10) Patent No.: US 7,277,002 B2
(45) Date of Patent: *Oct. 2, 2007

(54) ELECTRONIC TRANSFORMER/INDUCTOR DEVICES AND METHODS FOR MAKING SAME

(75) Inventor: Philip A. Harding, Palos Verdes, CA (US)

(73) Assignee: Multi-Fineline Electronix, inc., Anaheim, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/528,050

(22) PCT Filed: Sep. 15, 2003

(86) PCT No.: PCT/US03/29053

§ 371 (c)(1),
(2), (4) Date: Feb. 6, 2006

(87) PCT Pub. No.: WO2004/025671

PCT Pub. Date: Mar. 25, 2004

(65) Prior Publication Data

US 2006/0132276 A1    Jun. 22, 2006

(51) Int. Cl.
*H01F 5/00*  (2006.01)
(52) U.S. Cl. .................. 336/200; 336/223; 336/232; 29/602.1
(58) Field of Classification Search ........... 336/223, 336/200, 232; 29/602.1
See application file for complete search history.

(56) References Cited

U.S. PATENT DOCUMENTS

| | | | |
|---|---|---|---|
| 3,372,358 A | 3/1968 | Roy et al. | |
| 3,583,066 A | 6/1971 | Carbonel | |
| 3,684,991 A | 8/1972 | Trump et al. | |
| 3,898,595 A | 8/1975 | Launt | |
| 4,253,231 A | 3/1981 | Nouet | |
| 4,383,235 A | 5/1983 | Layton et al. | |
| 4,547,705 A | 10/1985 | Hirayama et al. | |
| 4,622,627 A | 11/1986 | Rodriguez et al. | |
| 4,901,048 A | 2/1990 | Williamson | |
| 5,070,317 A | 12/1991 | Bhagat | |
| 5,126,714 A | 6/1992 | Johnson | |
| 5,257,000 A | 10/1993 | Billings et al. | |
| 5,300,911 A | 4/1994 | Walters | |
| 5,392,020 A | 2/1995 | Chang | |
| 5,487,214 A | 1/1996 | Walters | |
| 5,514,337 A | 5/1996 | Groger et al. | |
| 5,532,667 A | 7/1996 | Haertling et al. | |
| 5,781,091 A | 7/1998 | Krone et al. | |

(Continued)

FOREIGN PATENT DOCUMENTS

DE    43 01 570 A    7/1993

(Continued)

*Primary Examiner*—Anh Mai
(74) *Attorney, Agent, or Firm*—Knobbe, Martens, Olson & Bear LLP

(57) ABSTRACT

The present invention relates to transformer inductor devices and to the methods of construction for inductive components such as inductors, chokes, and transformers. Plural via holes 12 are formed through a ferromagnetic substrate 10. Primary 32 and secondary 34 conductors are placed through common vias to form a plurality of cell transformers have a 1:1 turns ratio. Circuits connect these primary and secondary winding in parallel and serial combustion to provide a transformer having the desired turns ratio.

12 Claims, 35 Drawing Sheets

6 Cell Transformer
turns ratio=6 to 1
(primary to secondary)
$V_{in} = 6 * V_{out}$
$I_{in} = 1/6 * I_{out}$
Max current in Cell=$1/6 * I_{out}$

U.S. PATENT DOCUMENTS

| | | |
|---|---|---|
| 5,802,702 A | 9/1998 | Fleming et al. |
| 5,877,669 A | 3/1999 | Choi |
| 5,898,991 A | 5/1999 | Fogel et al. |
| 5,996,214 A | 12/1999 | Bell |
| 6,040,753 A | 3/2000 | Bicknell et al. |
| 6,148,500 A | 11/2000 | Krone et al. |
| 6,211,767 B1 | 4/2001 | Jitaru |
| 6,222,733 B1 | 4/2001 | Gammenthaler |
| 6,262,463 B1 | 7/2001 | Miu et al. |
| 6,270,375 B1 | 8/2001 | Cox et al. |
| 6,278,354 B1 | 8/2001 | Booth |
| 6,329,606 B1 | 12/2001 | Freyman et al. |
| 6,383,033 B1 | 5/2002 | Politsky et al. |
| 6,593,836 B1 | 7/2003 | Lafleur et al. |
| 6,820,321 B2 | 11/2004 | Harding |
| 2004/0135662 A1 | 7/2004 | Harding |
| 2005/0034297 A1 | 2/2005 | Harding |
| 2005/0093672 A1 | 5/2005 | Harding |

FOREIGN PATENT DOCUMENTS

| | | |
|---|---|---|
| DE | 196 39 881 A | 4/1998 |
| EP | 0 033 441 A | 8/1981 |
| EP | 0 262 329 A | 4/1988 |
| EP | 0 512 718 A | 11/1992 |
| EP | 0 756 298 A | 1/1997 |
| EP | 0 880 150 A | 11/1998 |
| EP | 0 936 639 A | 8/1999 |
| JP | 363228604 A | 9/1988 |
| JP | 03-276604 | 12/1991 |
| JP | 07-022241 | 1/1995 |
| JP | 09-083104 | 3/1997 |
| JP | 09-186041 | 7/1997 |
| JP | 11-040915 | 2/1999 |
| JP | 11-243016 | 9/1999 |
| JP | 11-312619 | 11/1999 |
| TW | 432412 | 5/2001 |
| WO | WO98/43258 | 10/1998 |
| WO | WO 02/32198 A2 | 4/2002 |
| WO | WO 02/32198 A3 | 4/2002 |
| WO | WO 2004/025671 A3 | 3/2004 |

Array of 70 cores laminated onto a large panel of FLEX
(top FLEX removed to show the individual cores)

Side view showing top & bottom FLEX laminated
to "core" in a panel of 70 "cores"

Side view showing top & bottom PCB laminated to "core" in a panel of 25 "cores"

Cross section of via hole

Cross section of via hole of "core" with screened conductive paste

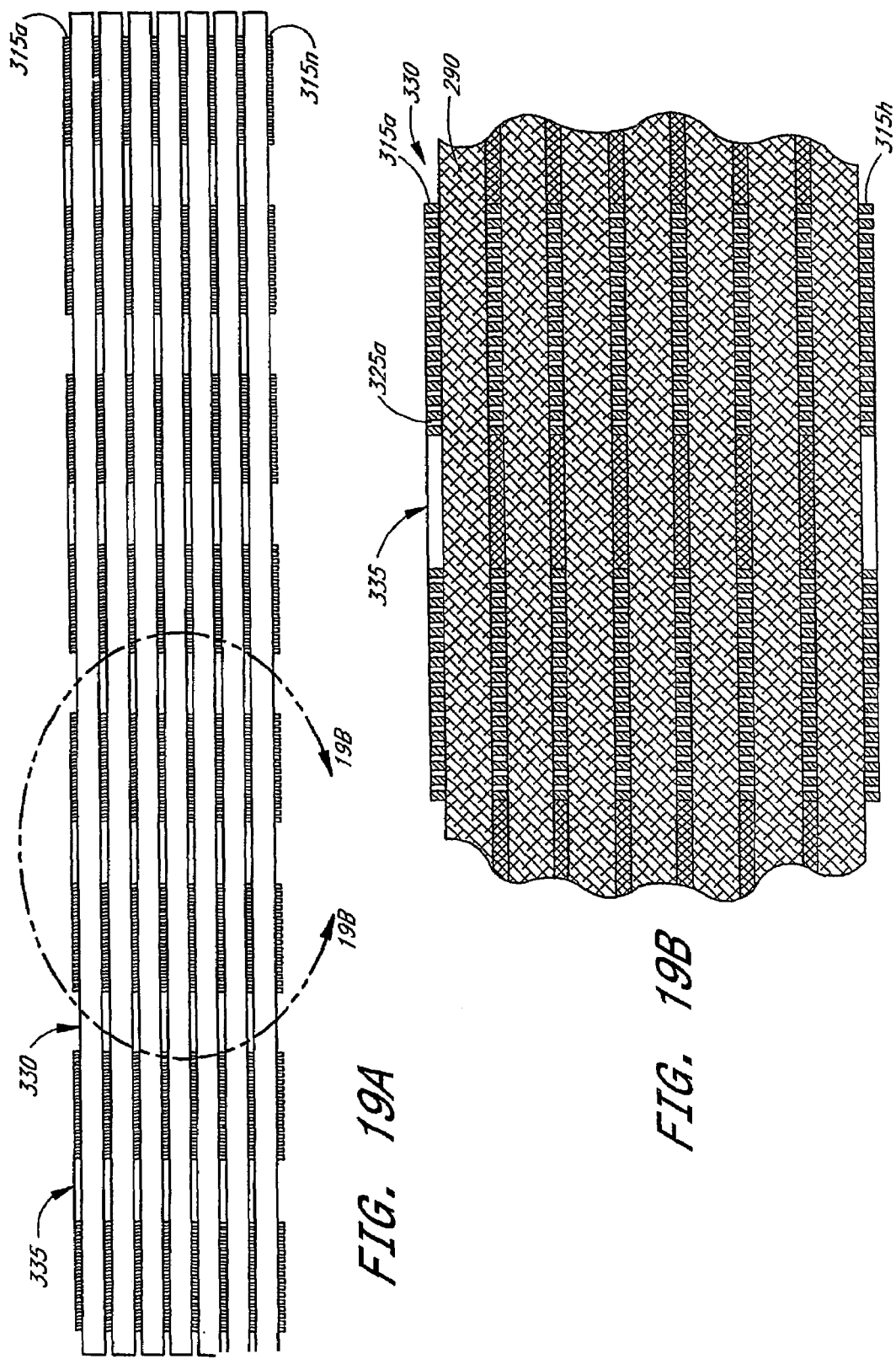

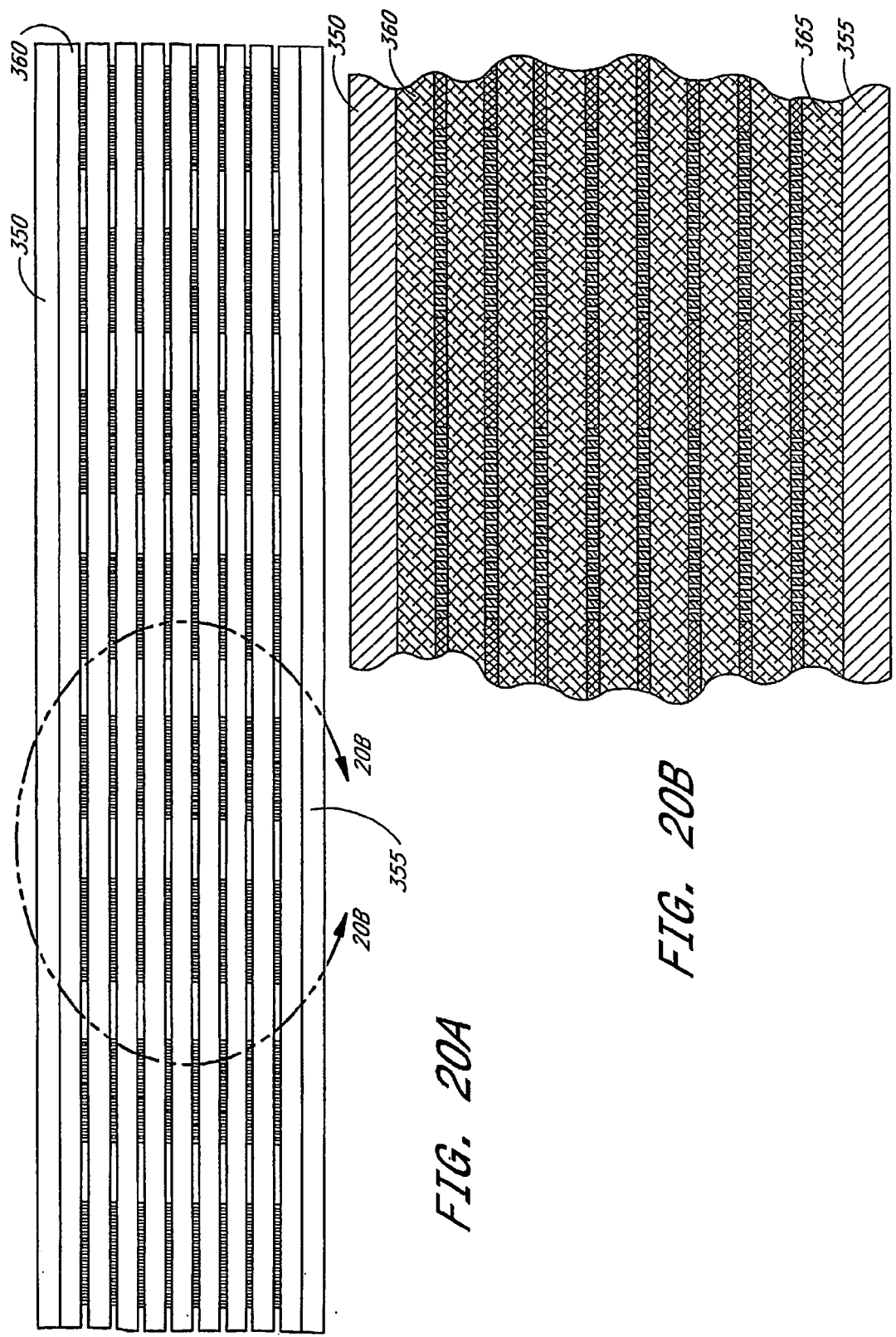

6 Cell Transformer
turns ratio=2 to 1
(primary to secondary)
$V_{in} = 3 * V_{out}$
$I_{in} = 1/3 * I_{out}$
Max current in Cell=$1/3 * I_{out}$

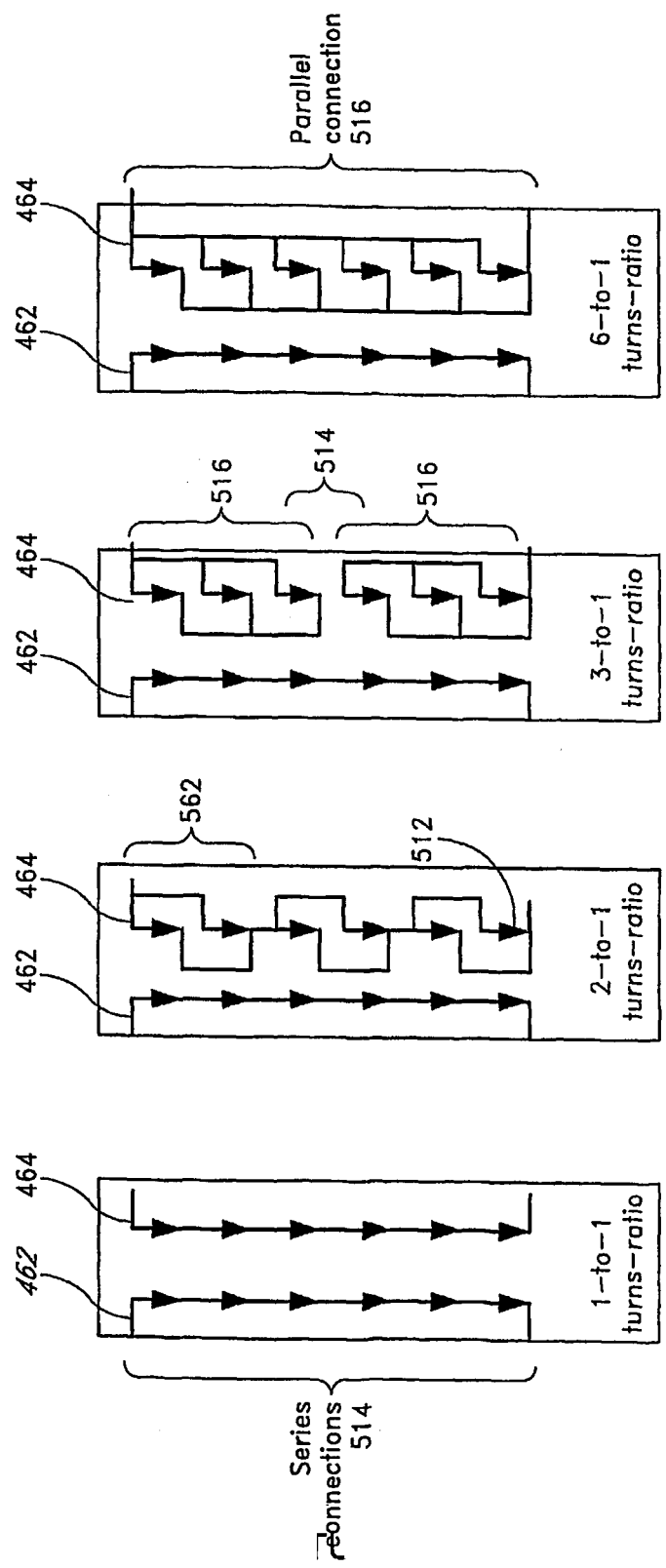

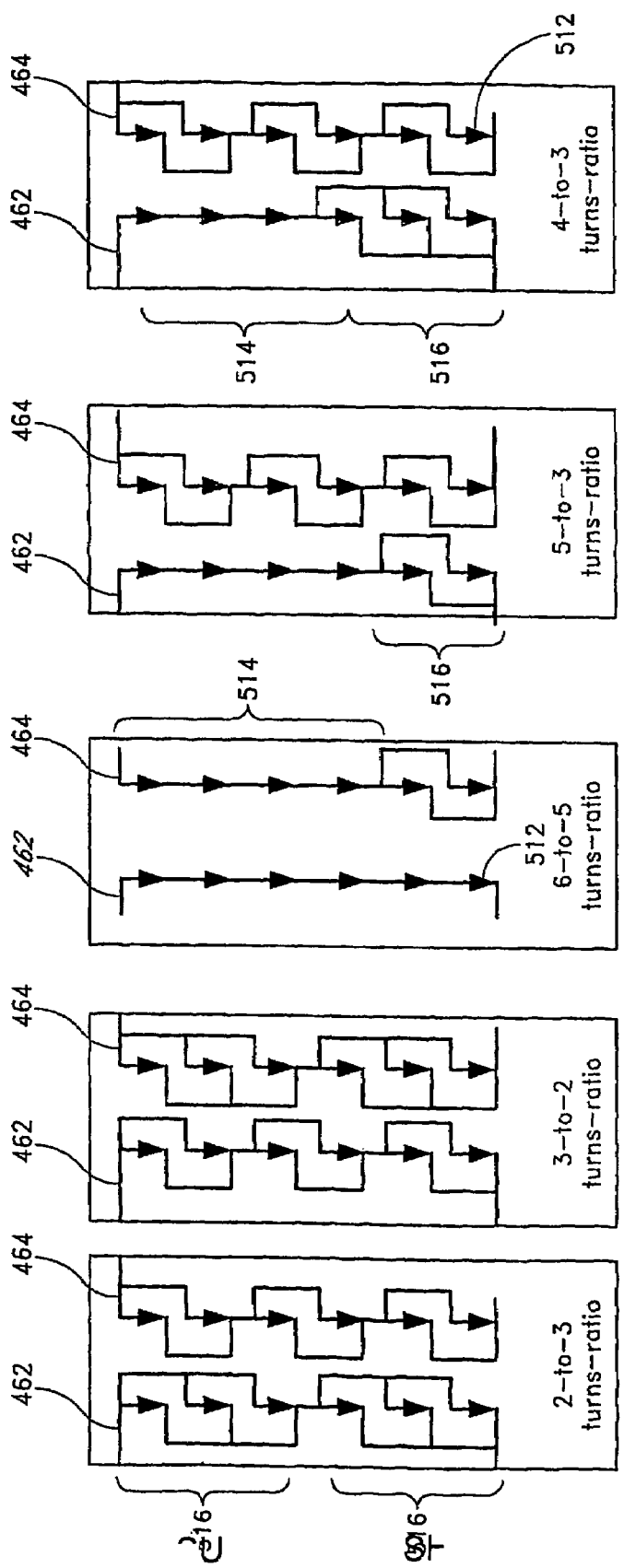

US 7,277,002 B2

ELECTRONIC TRANSFORMER/INDUCTOR DEVICES AND METHODS FOR MAKING SAME

FIELD OF THE INVENTION

The present invention relates to inductive components and methods for manufacturing these components.

BACKGROUND OF THE INVENTION

Inductive components are commonly fabricated using ferromagnetic cores and windings of insulated electrical wire. The ferromagnetic cores are typically toroidal cores, rod cores, or assemblies made of a lower E shaped ferromagnetic part and a ferromagnetic cap connecting the three legs of the E such as shown in FIG. 1.

The toroid and rod cores are manually or automatically wound with the insulated copper wire to form a number of multiple turn windings for a transformer or a single winding for an inductor. The assembly is then typically encapsulated to protect the wires. The circuit connection is made by the solder termination of the wires as required by the application. This approach has high labor costs because of individual part handling. It has large variability in electronic parameters such as leakage inductance, distributed and inter-winding capacitance, and common mode imbalance between windings because of the difficulty in exact placement of the copper wires.

The E shaped and encompassing cap assembly of FIG. 1 is made into an inductive component by manually or automatically winding copper insulated wires around the legs of the E as required. Either gluing or clamping the cap in place and final encapsulation completes this subassembly. Similarly, the circuit connection is made by means of solder termination of the wires as required by the application. Not only does this device have the limitations of the toroid and rod core, as mentioned above, but also it generally is a much larger device. Because the cap is a separate device the magnetic paths have a resistance of non-ferromagnetic gaps between the E and the cap reducing the efficiency of the transformer.

Power transformers constructed as shown in FIG. 1 have the further disadvantage that the heat resulting from the resistance losses in the windings is not easily dissipated because the E core and cap isolate these windings from a heat sink.

SUMMARY OF THE INVENTION

The embodiments of the present invention provide inductors and transformers and methods of manufacturing these devices which offer advantages over the state-of-the-art. These inductors and transformers connected in accordance with this invention have a number of applications in the electronics, telecommunication and computer fields. In one embodiment described below, a rectangular slab of ferromagnetic material is encapsulated between printed circuitry. A plurality of through holes (vias) are drilled through or formed during manufacture of the slab from the top face of the slab to the bottom face of the slab, the number of holes corresponding to the number of desired turns of the windings. This embodiment utilizes Ampere's Law in a very novel manner to form a transformer, inductor, or the like within the circuit board rather than the use or assembly of discrete inductive devices to the circuit board. Thus, the windings are not insulated electric wires. Rather, the holes through the slab are made electrically conductive by through hole plating or the like and electrically connect with the printed circuits encapsulating the slab. This pattern of plated through holes and the printed circuitry form the inductor and transformer windings with the core of the inductors and transformers being the drilled or formed slab of ferromagnetic material. This embodiment provides substantial improvements, particularly in fabricating high frequency inductors and transformers.

In another embodiment described below, the core of the inductors or transformers comprises cores formed by a multi-layer series of thin concentric ferromagnetic metal rings supported on a suitable substrate such as a flex circuit (FLEX) or printed circuit board (PCB). Through holes proximate these concentric ring cores provide electrical connection with printed circuitry to provide the inductor and transformer windings. This embodiment enables construction of high permeability inductors and transformers having minimal eddy current effects. Inductors and transformers so constructed have particular application for miniature low frequency power supplies.

In another embodiment described below, a single conductor is formed within a via in a thin ferromagnetic slab to create a single turn inductor. Current passing through the conductor generates a circulating magnetic field in a portion of the slab proximate the via.

In other embodiments described below, first and second conductors are formed within the same via of a ferromagnetic slab to create a cell core 1-to-1 turns-ratio transformer. By connecting the first and second conductors of multiple vias in series and parallel combinations, a transformer having the desired turns-ratio may be constructed. Additional windings may be added to the inductor or transformer by forming additional sensing conductors within additional vias in the ferromagnetic slab. Inductors and transformers so constructed have particular application for miniature power transformers with high secondary current.

In addition to the advantages described above, the embodiments of the present invention have a number of additional advantages. These include: superior heat removal, outside connections that are more accessible to simplify electrical connection, shorter flux paths to increase magnetic performance, simpler fabrication, interconnections that are more integrated, smaller inductive devices, superior performance, and excellent manufacturing repeatability.

BRIEF DESCRIPTION OF THE DRAWINGS

Having thus summarized the general nature of the invention and its features and advantages, certain embodiments and modifications thereof will become apparent to those skilled in the art from the detailed description herein having reference to the figures that follow, of which:

FIG. 19A is a is a cross-sectional view showing a plurality of stacked core laminations;

FIG. 19B is an enlarged view of one of the core stacks of FIG. 19A;

FIG. 20A is a cross-sectional view showing the stack of FIG. 19A after the top and bottom printed circuits have been added;

FIG. 20B is an enlarged view of one of the core stacks of FIG. 20A;

FIGS. 32A-32I show symbolic representations of series and parallel connections of primary and secondary windings passing through six cell cores to form further transformer embodiments;

DETAILED DESCRIPTION OF THE PREFERRED EMBODIMENTS

Figure 2A:
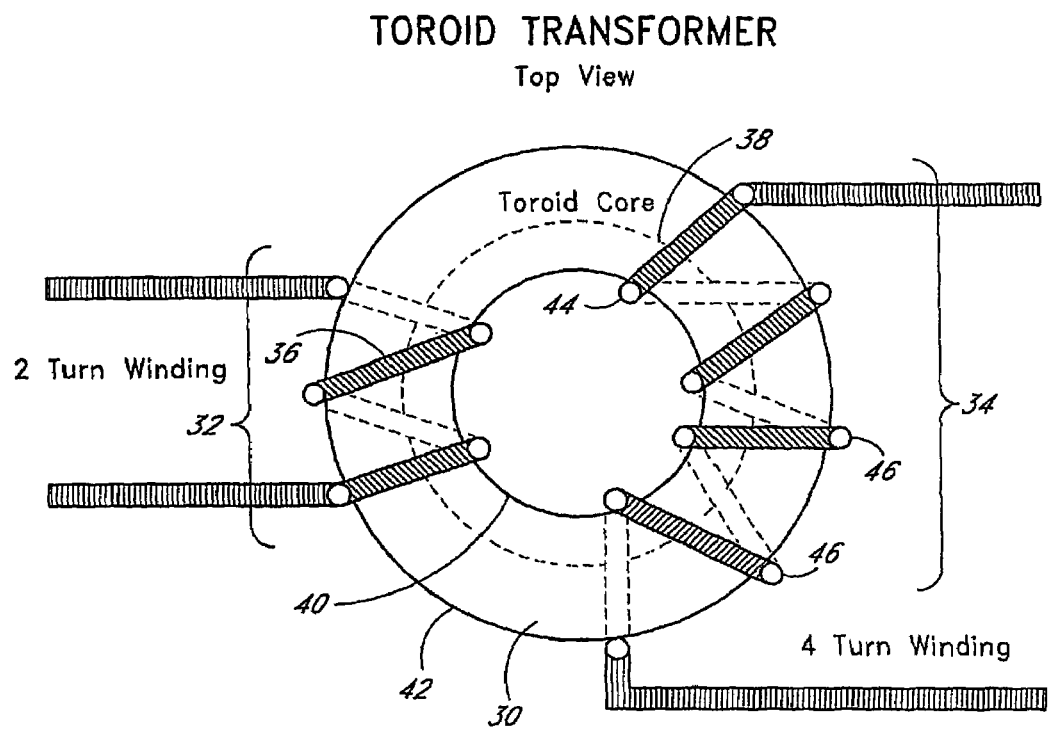
FIG. 2A is a top view of a conventional toroidal transformer.
Figure 2B:
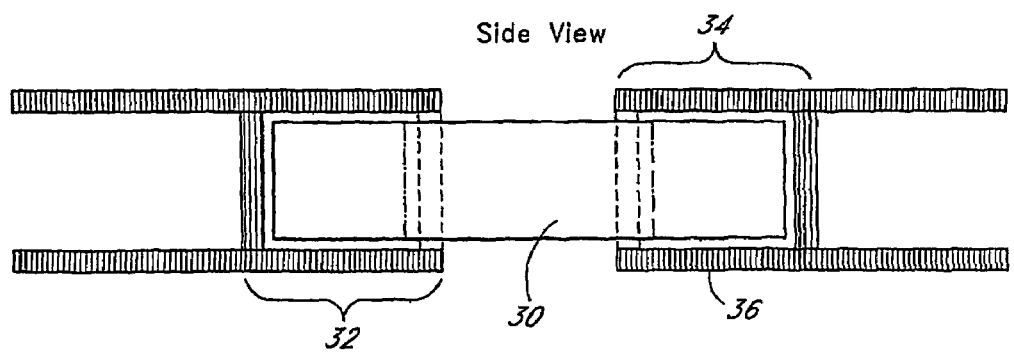
FIG. 2B is a side view of a conventional transformer.

FIG. 2 illustrates a typical prior art transformer with a toroidal core 30. For simplicity this transformer has two windings of insulated wire: a two-turn winding 32 and a four-turn 34 winding. Each turn 36 encircles the material of the core 30 such that when electrical current is passed through one winding an encircling magnetic flux path 38 flows within the core 30. FIG. 2A illustrates the windings 32, 34 passing through the center of the core 30, and around the outside of the core 30. The windings 32, 34 as shown in FIG. 2 are inductively coupled together by way of the core 30. The core 30 provides a magnetic flux path which couples the first winding 32 to the second winding 34 thereby generating an electrical voltage at the second winding when there is a voltage present at the first.

Figure 3:
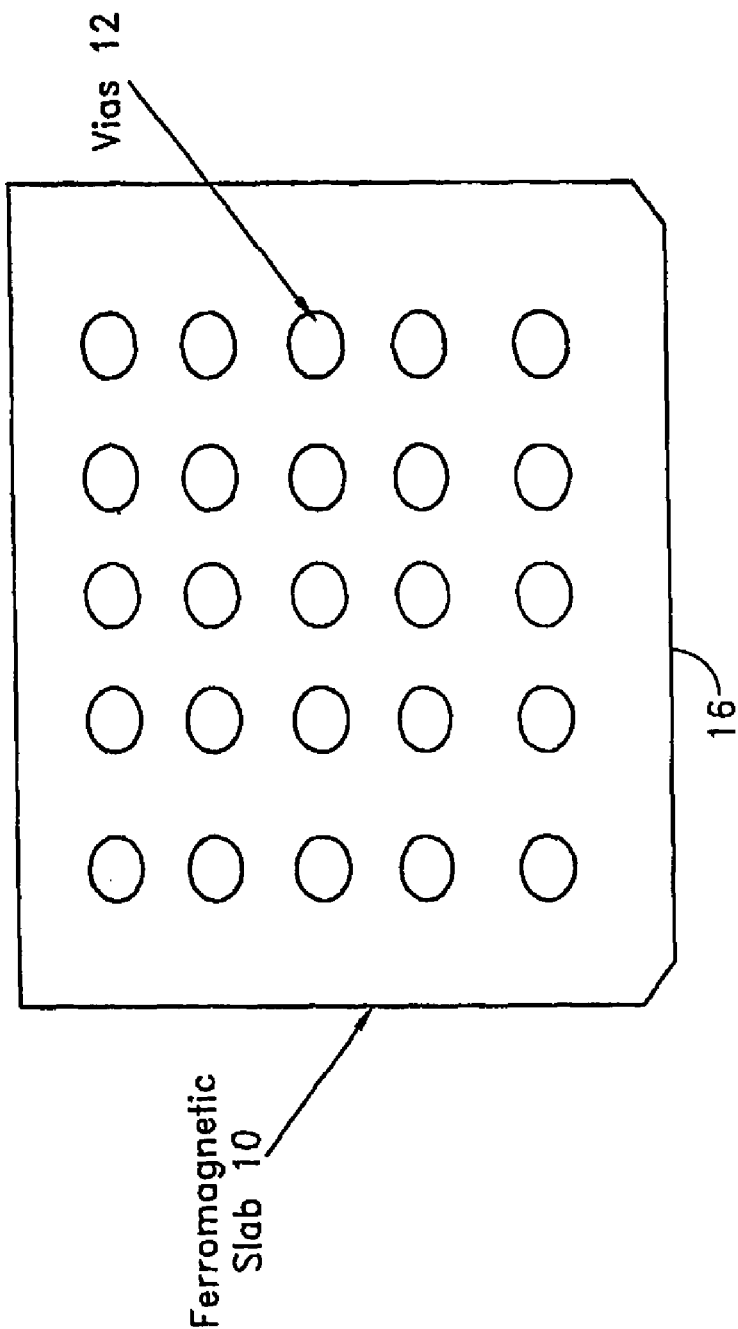
FIG. 3 is a top view of a representation of a ferromagnetic slab having 25 vias extending through it.

Embodiments of the present invention have a very different core and winding arrangement than that shown in FIG. 2. FIG. 3 shows a ferromagnetic slab 10 having a plurality of appropriately spaced through holes or vias 12 extending from the top surface 14 to the bottom surface 16 of the slab 10 from which an inductor or transformer may be formed. While FIG. 3 shows a total of 25 vias 12 that have been drilled or formed within the slab 10, the number of vias 12 used may depend upon the number of windings required for a particular application. As will become apparent, inductors or transformers may be formed by selectively arranging the vias 12 and plating conductors through and between the vias 12 on both the top surface 14 and the bottom surface 16 to form primary and secondary windings. Secondary windings may also be formed by placing a second set of insulated conductors through the vias 12.

The terms "slab" and "ferromagnetic slab" are used throughout this application and are intended to be broad terms describing any useful configuration of ferromagnetic material including, but not limited to, sheets, thin sheets, planar members, and layers of ferromagnetic material.

The "Virtual Core"

FIG. 4 illustrates a "virtual core" according to the present invention. Due to the pattern formed by the vias 56, 68, the embodiment shown in FIG. 4 is also referred to herein as a "virtual toroid core" or "virtual toroid". In FIG. 4, slab 50 of ferromagnetic material has a top surface 52 and bottom surface 54, and, shown in cross-sections, two outer holes (vias) 56 and one inner hole (via) 68 within the slab 50. As described below, for miniature inductors and transformers, the slab 50 is advantageously a thin layer of ferrite having a relatively high resistivity.

Figure 4B:
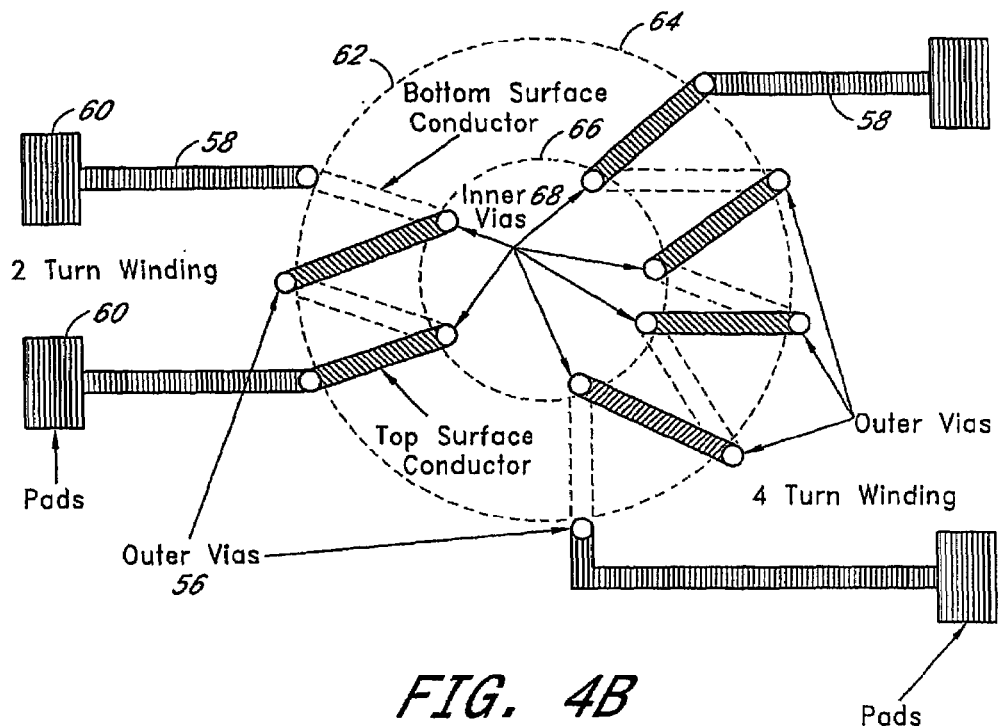
FIG. 4B is a side view of the virtual transformer of FIG. 4A.
Figure 4A:
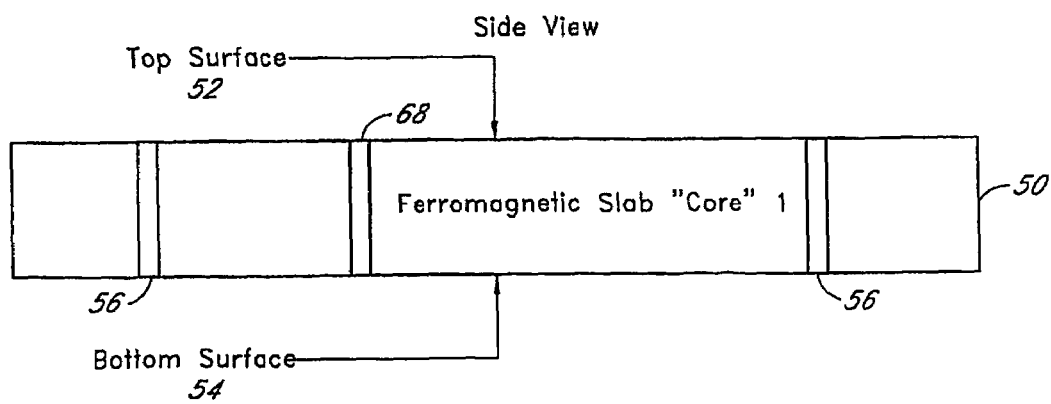
FIG. 4A is a top view of a representation of a "virtual" toroidal transformer.

FIGS. 4A and 4B show a virtual core employed as a virtual toroid transformer constructed in accordance with the present invention using the slab 50 with eight outer via holes 56 and six inner via holes 68 (not all of which are shown in FIG. 4B). Conductors 58 are formed on the top 52 and bottom 54 surfaces of the slab. The conductors have pads 60 for connection to other devices, or circuitry. As described below, these outer and inner vias 56, 68 are plated through from top to bottom and in electrical contact with the conductor 58 so that a complete electrical circuit extends between, for example, pad 60 and pad 60'. As described below, a virtual toroidal transformer 62 is thus formed having a circular path 64.

Figure 5:
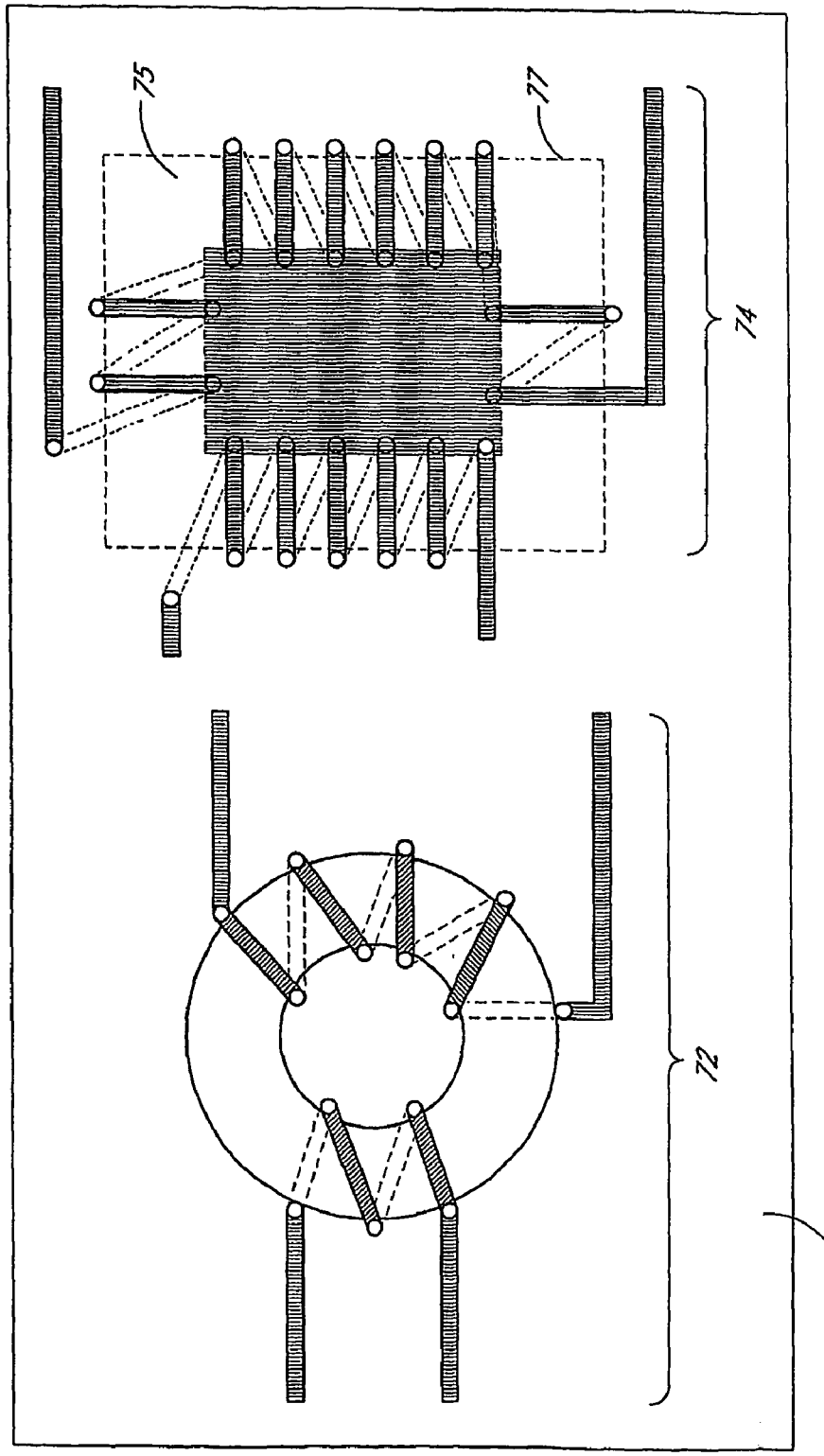
FIG. 5 shows a top view of other embodiments of a virtual transformer.

FIG. 5 illustrates a ferromagnetic slab 70 with two independent virtual cores 72, 74 residing on the same slab 70. The second transformer 74 illustrates another embodiment of the invention in which the vias are rearranged in specific patterns. This rearrangement forms a rectangular virtual toroid 75 with an inner rectangle 76 and an outer rectangle 77.

Figure 6:
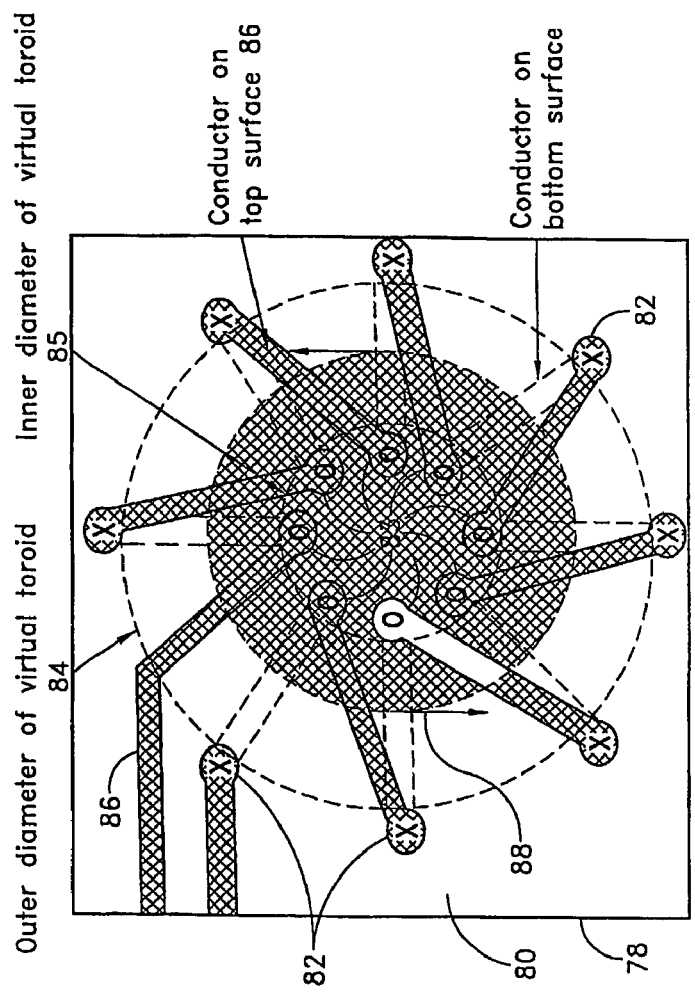
FIG. 6 is a top view of a representation of a "virtual" toroidal transformer.

FIG. 6 illustrates another embodiment of a virtual core formed in a ferromagnetic slab 78 having a top surface 80 and a bottom surface (not shown). The ferromagnetic slab 78 has eight outer vias 82 arranged to form an outer diameter 84 of a virtual toroid and eight inner vias 83 arranged to form an inner diameter 85 of the virtual toroid. Conductors 86 are formed on the top 80 and the bottom surfaces of the slab 78 and are plated through the outer 82 and inner 83 vias to form one continuous electrical path or winding. As described below, the virtual core shown in FIG. 6 forms a virtual toroid inductor with an eight turn winding.

Fabrication as Part of a FLEX

Figure 7:
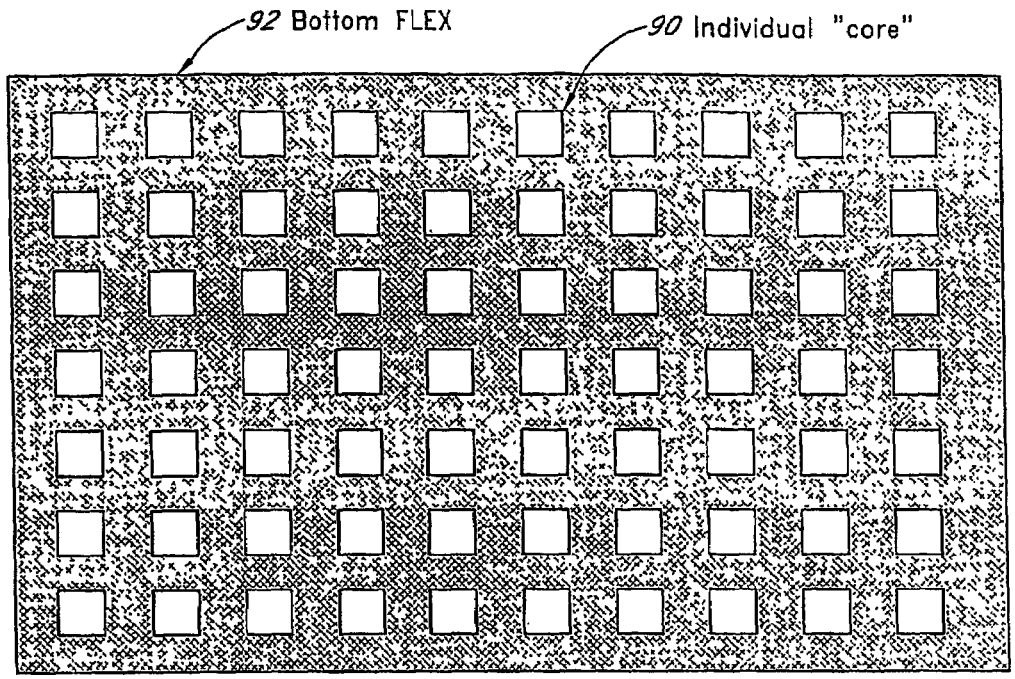
FIG. 7 shows an array of 70 cores laminated onto a large panel of FLEX with the top FLEX layer removed to show the individual cores.
Figure 8:
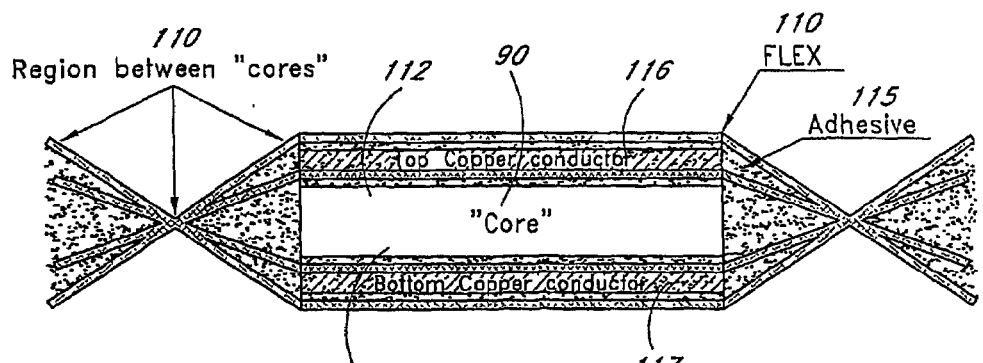
FIG. 8 is an enlarged side view showing top and bottom FLEX laminated to an individual core slab.
Figure 9:
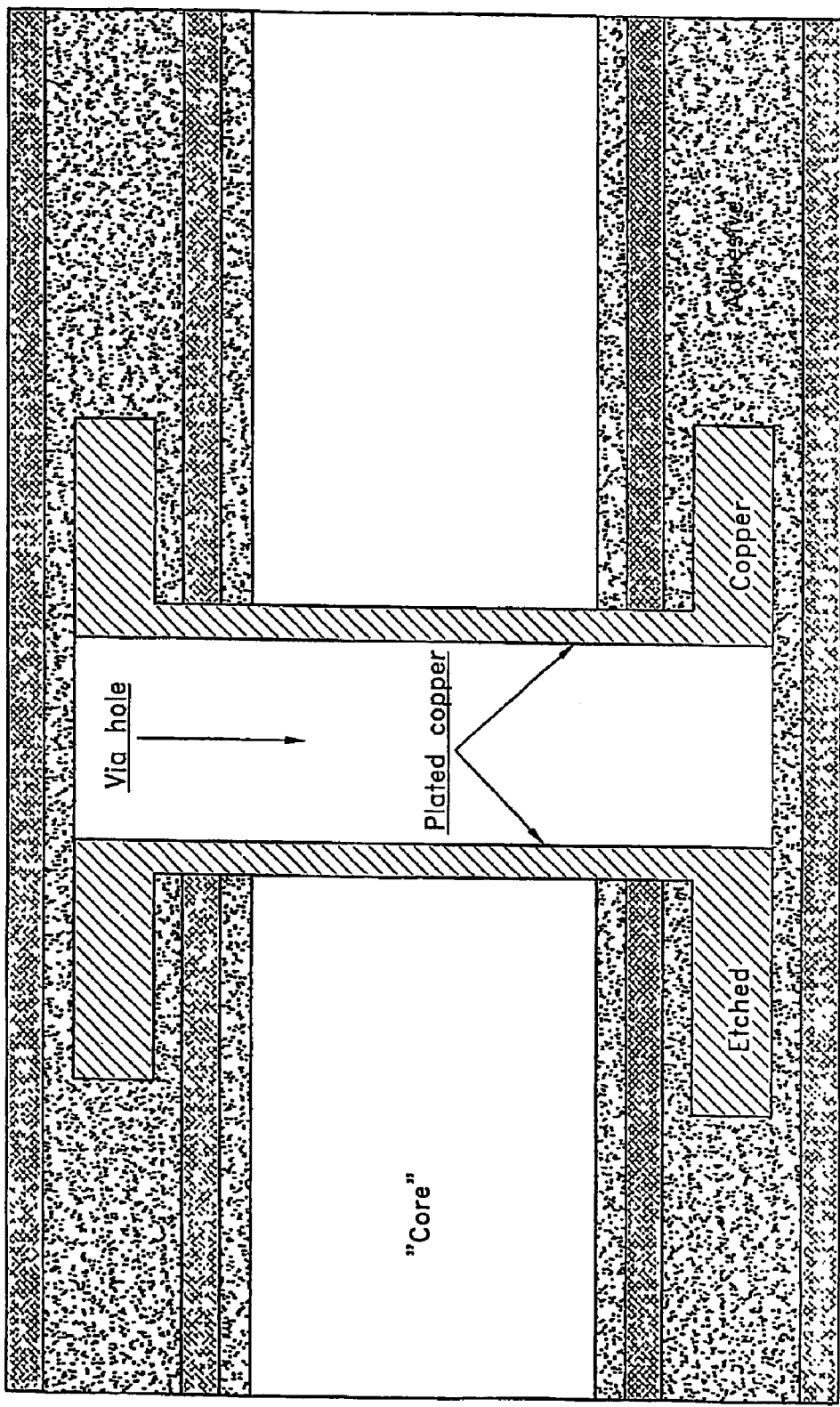
FIG. 9 shows a cross-section of a via hole in an individual slab.

One method of fabrication is to embed a multiplicity of ferromagnetic slabs (cores 90) within the top and bottom layers of FLEX 92 circuits such as shown in FIGS. 7, 8 and 9. Copper circuit patterns 92 corresponding to the desired windings are formed on an epoxy sheets 110 which are glued to the top and bottom surfaces 112, 114 of the slab by adhesive 115. The cores 90 are thus contained in the circuits 92 by a lamination process. Via holes are formed through the composite layers of FLEX 92, and the cores, to form a connection between the top FLEX 116 circuitry to the bottom FLEX 117 circuitry, as illustrated in FIGS. 8 and 9. Filling vias with conductive inks and standard industry plating processes are methods used to make the connections for large numbers of virtual cores simultaneously. The cross section of this construction is shown in FIGS. 8 and 9.

Fabrication as Part of a PCB

Figure 10:
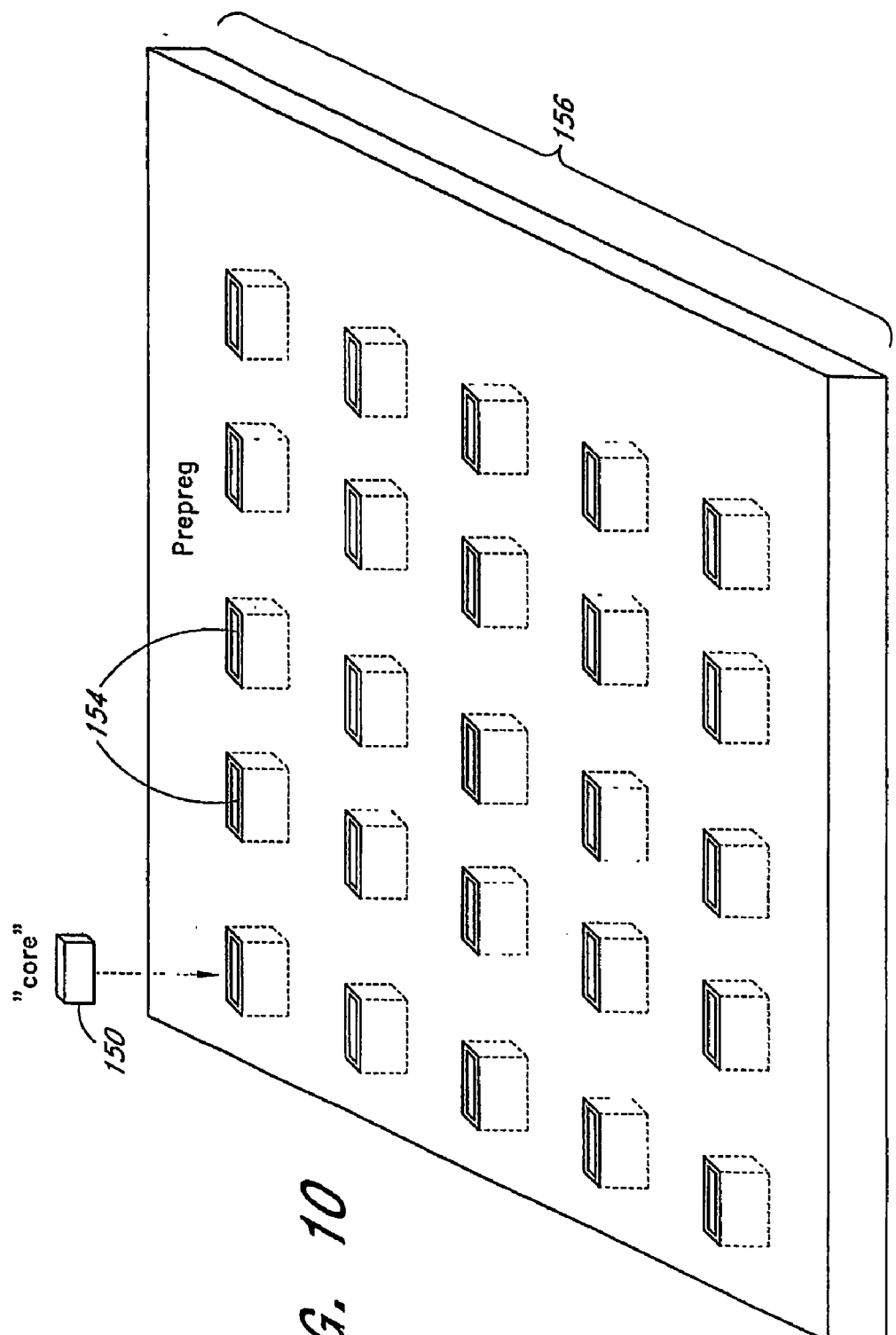
FIG. 10 shows an example of a PCB prepreg with an array of 25 holes to house 25 cores.
Figure 11:
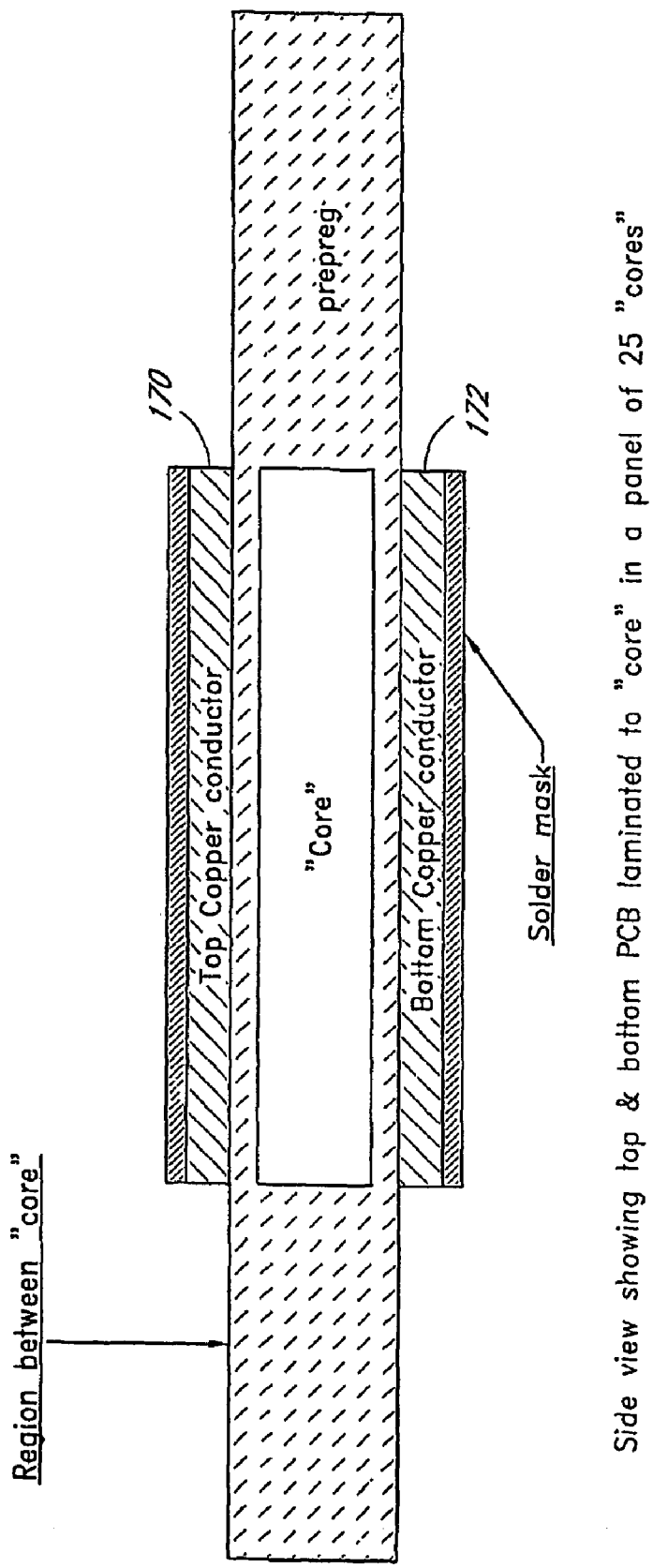
FIG. 11 is an enlarged side view of an individual core showing top and bottom PCB laminated to the core.
Figure 12:
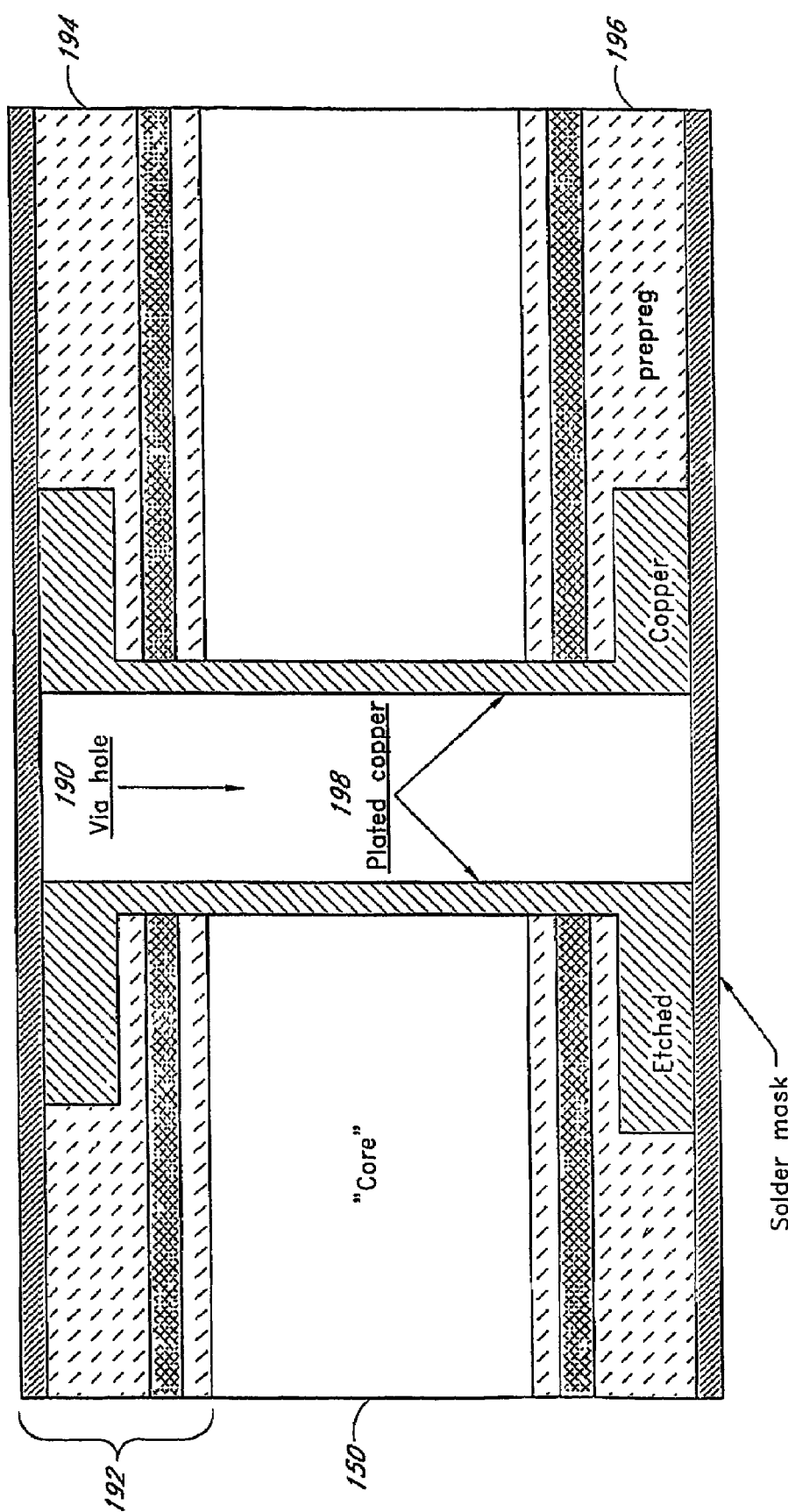
FIG. 12 an enlarged cross-section of a via hole in an individual ferromagnetic slab.

Another method of fabrication shown in FIGS. 10, 11, and 12 is to embed a multiplicity of ferromagnetic pieces 150, between the top 170 and bottom 172 layers of PCB circuits. FIG. 10 shows an array of holes 154 in a PCB adhesive, or prepreg array 156. This prepreg 156 panel is formed to accommodate each core piece 150. As shown in FIG. 11, after the pieces 150 are inserted into the holes 154 a top section 170 and a bottom section 172 of PCB are laminated to the array 156. The pieces 150 are thus contained by the lamination process which sandwiches the pieces 150 between two sheets of epoxy. Via holes 190 are formed through the composite layers of PCB 192, and pieces 150, to form a connection between the top PCB 194 circuitry and the bottom PCB 196 circuitry. Vias 190 filled with conductive inks 198 or standard industry plating processes are advantageously used to make the connection for a large number of cores simultaneously. The cross section of this construction is similar to the FLEX 117 construction shown in FIGS. 8 and 9. The major difference is due to the inflexibility of the PCB material, which does not conform to the individual pieces 150.

Fabrication without a FLEX or PCB

Figure 13:
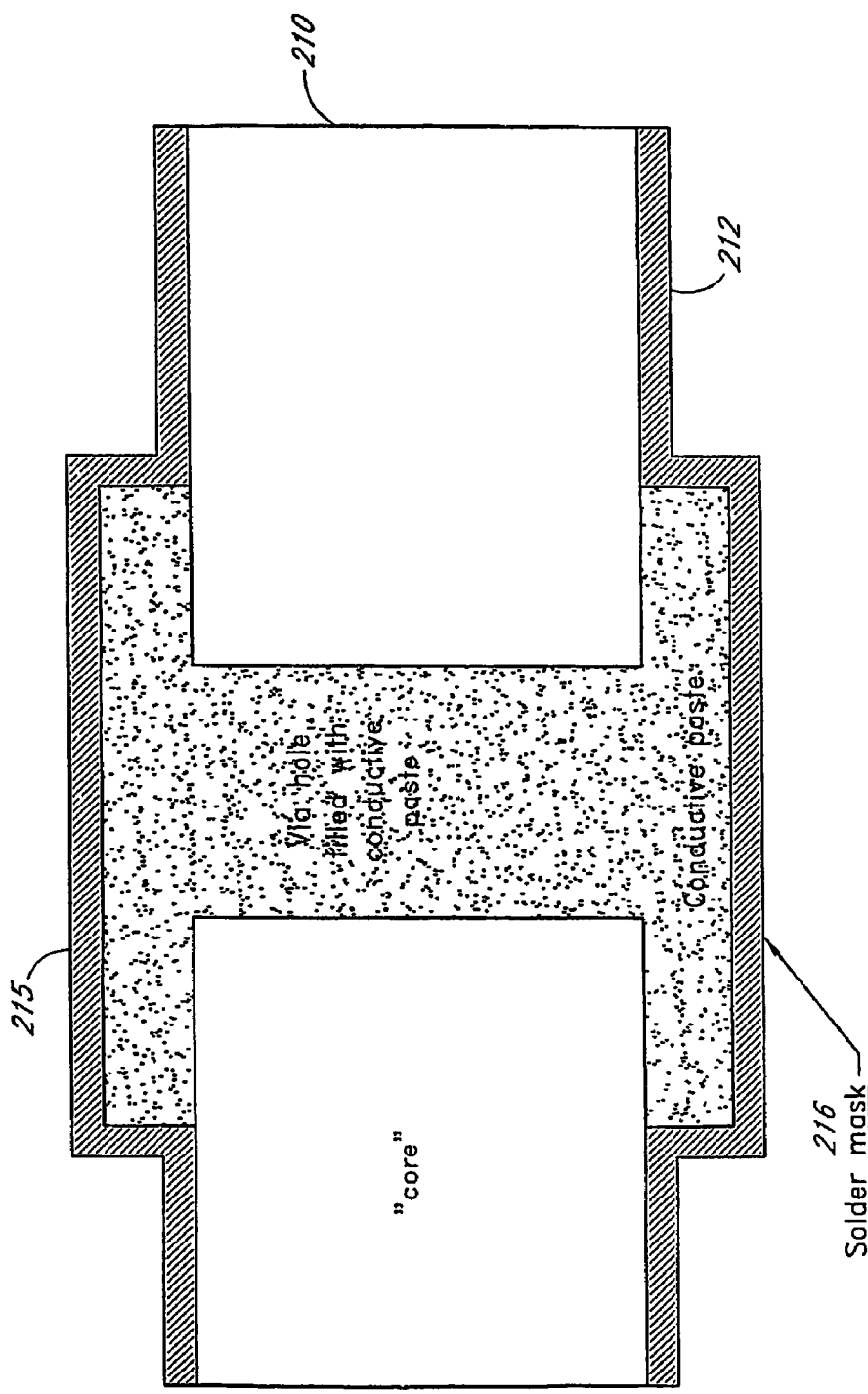
FIG. 13 is an enlarged cross-section of a via hole filled with screened conductive paste.

Another method of fabrication is shown in FIG. 13 in which a multiplicity of cores 210 are retained on a carrier 212. Each core 210 is molded with appropriate holes 214. Standard industry conductive ink screening processes are then used to form the circuits on the top 215 and bottom 216 of the cores 210 while simultaneously filling the holes 214 to make the required connection between the top 215 and bottom 216 sides.

Virtual Core's Employment of Ampere's Law

The embodiments of the invention described above, with conductive vias through the magnetic slab, employ Ampere's Law in a very novel manner. The vias are formed in such fashion as to allow a flux path to exist between two windings formed on the substrate. Thus, as shown in FIG. 4A, any enclosed path that falls within the inner vias 68 will encompass zero net current, therefore such paths will have no magnetic flux. Any path that encompasses the outer vias 56 will also encompass zero net current because the inner holes 68 have an equal but opposite current flow to the current flowing in the outer holes 56 creating zero magnetic flux in the region encompassing the outer vias 56. However, the enclosed paths between the inner and outer vias 68, 56 will have a net magnetic flux due to the enclosure of the inner vias 68. Other paths that partially enclose inner or outer vias 68, 56 will not have significant magnetic flux because the flux will select the shortest physical path, similar to electrical current. Thus, this configuration will behave very similar to the toroid of FIG. 2, and is shown as a virtual toroid 62.

Ampere's Law is described by the equation:

$$\oint H \cdot (dl) = \Sigma I \qquad \text{(Eq. 1)}$$

where the line integral of the magnetic field intensity, H, around a closed path is equal to the sum of the current, I, intersecting the area enclosed by the path. With reference to FIG. 6, Ampere's Law states that any closed path line integral that falls within the inner vias 83 will encompass a zero net current since there are no current carrying vias within this region. Therefore, there will be no magnetic flux generated within the inner diameter 85 of the virtual toroid. Any closed path line integral encompassing the outer vias 82 will also have a zero net current intersecting the enclosed area because the eight inner vias 83 with current out of the holes is counterbalanced by the equal amount of current passing into the eight outer vias 82. Therefore, no magnetic flux will be generated within any region encompassing the outer diameter 84 of the virtual toroid.

The only region where there will be continuous flux is the area between the inner 85 and outer 84 diameters of the virtual toroid core. In this region, the closed path line integral will comprise the current summed from the eight inner vias 83 intersecting the enclosed area. Thus, the via pattern shown in FIG. 6 forms a virtual toroid inductor wherein the outer 84 and inner 85 diameters define a virtual toroid core energized by an eight turn winding. Dotted circle 88 represents the direction of the flux path that is confined to the area of the virtual toroid core.

It will be apparent that the proper selection of via holes enables many different shapes of virtual cores and arrangements of cores on substrates. Thus, many independent magnetic circuits can be constructed on the same substrate. Because of this, it is possible to construct more complex circuits than simple inductors and transformers by the appropriate placement of vias and circuit conductors on the top and bottom surfaces 52, 54 of the ferromagnetic slab 50 shown in FIG. 4. Using, for example, processes employed in conventional PCB and FLEX (flexible circuit boards) industries (photo-deposition, etching, and plating) multiple components such as resistors, capacitors and integrated circuits can be placed on the same substrate to form micro-miniature circuit assemblies.

Figure 14:
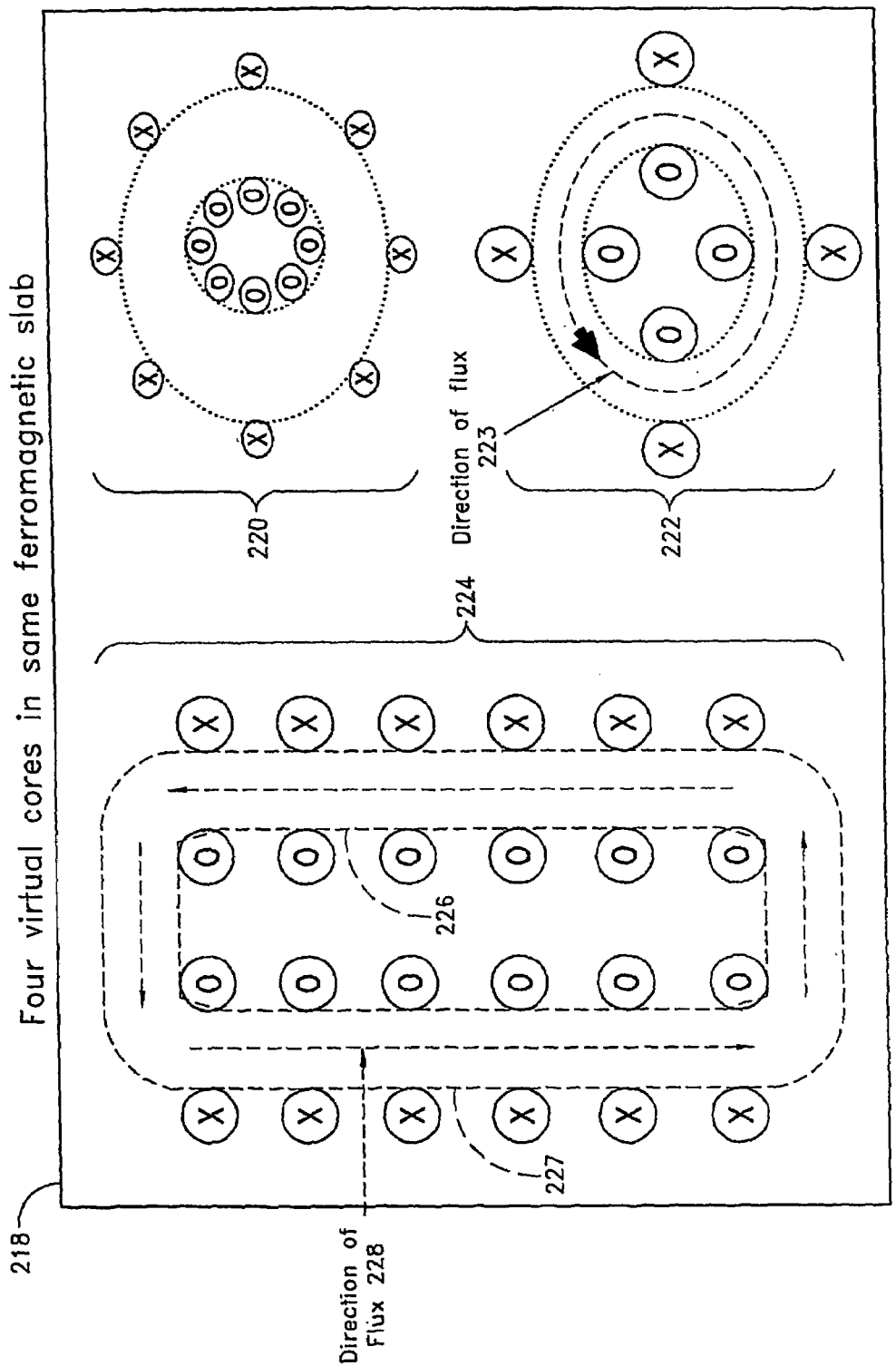
FIG. 14 shows a top view of other embodiments of a virtual core.

FIG. 14 illustrates a plurality of virtual cores 220, 222, 224 residing on the same ferromagnetic slab 218. Each virtual core 220, 222, 224 operates independently and may have circuit connections between and through the plated vias as shown in FIG. 6 to form either virtual toroid transformers or virtual toroid inductors. The first virtual core 220 may be energized by an eight turn winding such as the virtual toroid core illustrated in FIG. 6. The second virtual core 222 illustrates another embodiment in which the vias are arranged with the same geometry as the virtual toroid core in FIG. 6, but with fewer vias to form a virtual toroid core that may be energized by a four turn winding. Dotted circle 223 represents the direction of the flux path that is confined to the area of the virtual toroid core. The third virtual core 224 illustrates yet another embodiment in which the via pattern has been rearranged to form a rectangular virtual toroid core defined by an inner rectangle 226 and an outer rectangle 227. Rectangular virtual core 224 may be energized by a twelve turn winding. Dotted circle 228 represents the direction of the flux path that is confined to the area of the rectangular virtual toroid core.

Inductors and transformers useful for high frequency circuits such as are used for radio frequencies, typical ranges being 100 KHz to 100 MHz, can be constructed in accordance with the foregoing embodiments. The ferromagnetic slab in the foregoing embodiments may be advantageously formed of a thin layer of ferrite material having typical permeabilities in the range of 100 to 10,000 and resistivity in the range of 1,000 ohm/cm to 10.sup.9 ohm/cm. Typical ferrite compositions include ferric oxide and alnico. Such ferrite materials have a sufficiently high resistivity such that the plated vias through the slab are insulated one of the other. The transformers and inductors so constructed are adapted for miniaturization. They eliminate the need for complicated pins or lead-frames. Thus, a slab 1.5 inches long, 1 inch wide and 0.05 inches thick with 0.03 inch diameter vias can provide the core for two or more transformers. The ferromagnetic slabs may be very small. Surface pads on the top and bottom surfaces form the connections, and can be surface mounted directly to PCB's, thus reducing the footprint of the device and making more room for other components. The plotted windings are substantially in two parallel planes. Therefore the windings of a ten (10) layer planar transformer device, a typical application, can be reduced in overall height by a factor of five (5). The ferromagnetic slab may be very thin, e.g., 0.05 inches, so that the inductors and transformers of the invention may be constructed substantially in one very thin plane instead of a three-dimensional E core construction further reducing the overall height by a large factor.

Figure 16:
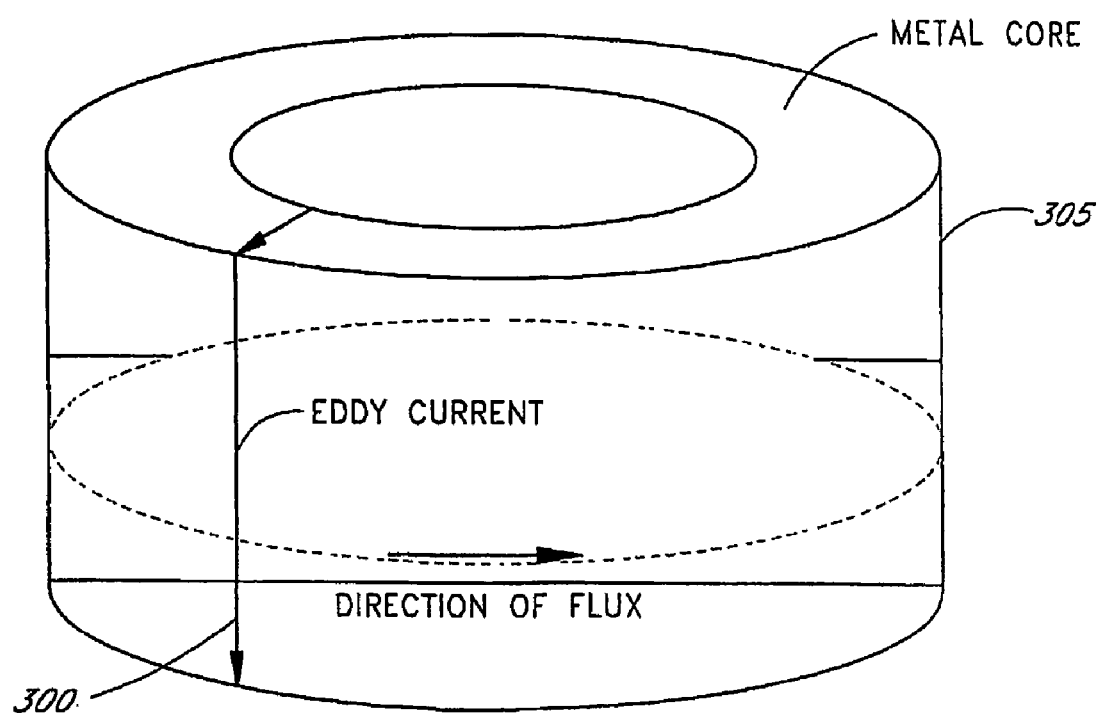
FIG. 16 shows a metal toroidal core illustrating the manner in which eddy currents are generated.

Further Embodiments of Transformer/Inductor Devices having High Flex Densities and Minimal Eddy Current Many inductive devices such as low frequency power transformers require cores having relatively high relative permeabilities typically in the range of 10,000 to 100,000. However, the improvements afforded by the embodiments of the present invention are applicable to lower and higher values, e.g., a range of 1,000 to 1,000,000. Certain metals and metal alloys provide these high flex densities including steel, iron, silica iron, 78 permalloy, Mumetal, purified iron, and supermalloy. Although these high flex densities can offer distinct advantages in constructing transformers and inductors, the low resistivity of the metals allow induced eddy currents to flow which counteract the benefits of the higher flux densities. The induced eddy currents 300 caused by the magnetic flux flowing in a metal core are illustrated in FIG. 16. Present day transformers/inductors that use metal as a core normally reduce these eddy currents by constructing the toroid or E core out of laminated metal E strips, with each strip separated by some type of dielectric bonding material. The entire E core contains many such strips to form the full core. By means of this configuration the eddy current is limited to the cross section area of each strip. As described below, one feature of this invention is to further reduce the core section areas.

The fabrication of one embodiment of this invention enabling use of ferromagnetic metal for the core material is illustrated in FIGS. 17-21 wherein a flex circuit or printed circuit board 290 supports a series of laminated thin metal annular rings formed on FLEX or PCB and separated by dielectric sheets. Plated via holes within the center and outside of the annular rings and plated complete the electrical turns around the core. As described below, this embodiment substantially minimizes eddy current by substantially reducing the cross sectional area of each laminated core section.

Figure 17:
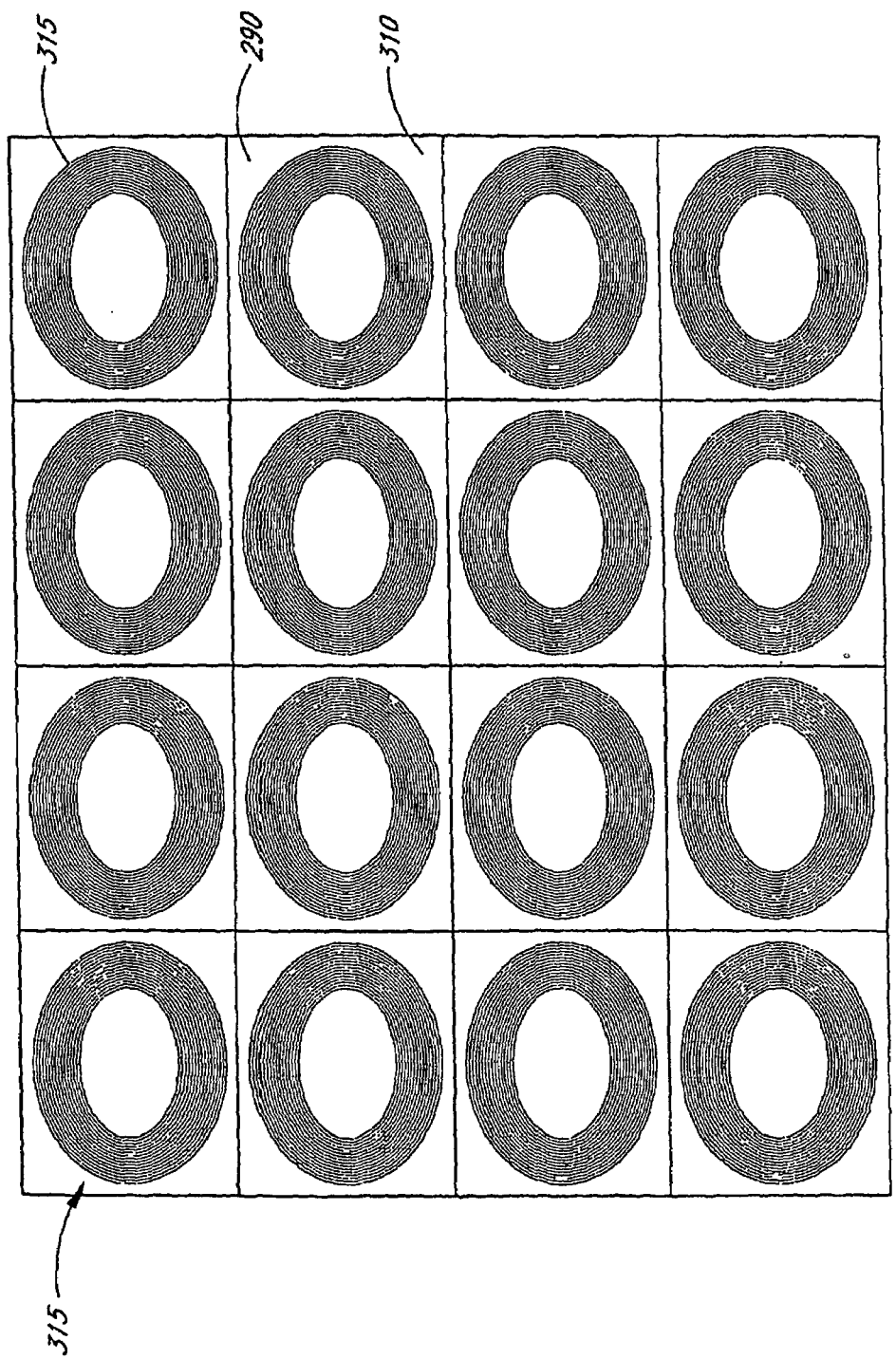
FIG. 17 illustrates a plurality of core laminations formed by etching concentric rings of ferromagnetic metal.

A plurality of core laminations are formed by first laminating the sheets of ferromagnetic metal to a PCB or FLEX 290 and then etching away portions of the ferromagnetic sheet to form a pattern of a plurality of closely spaced, narrow continuous core segments. Thus, FIG. 17 shows an individual layer of PCB or FLEX 310 with 16 etched core arrays. It will be understood that the lamination and etching processes known in the art will generally permit manufacture of more than 16 such arrays depending upon the size of the array and pattern. Advantageously, the core arrays 315 are etched using well known double-sided processes so that identical arrays are formed on both the top and bottom of sheet 310.

Figure 18:
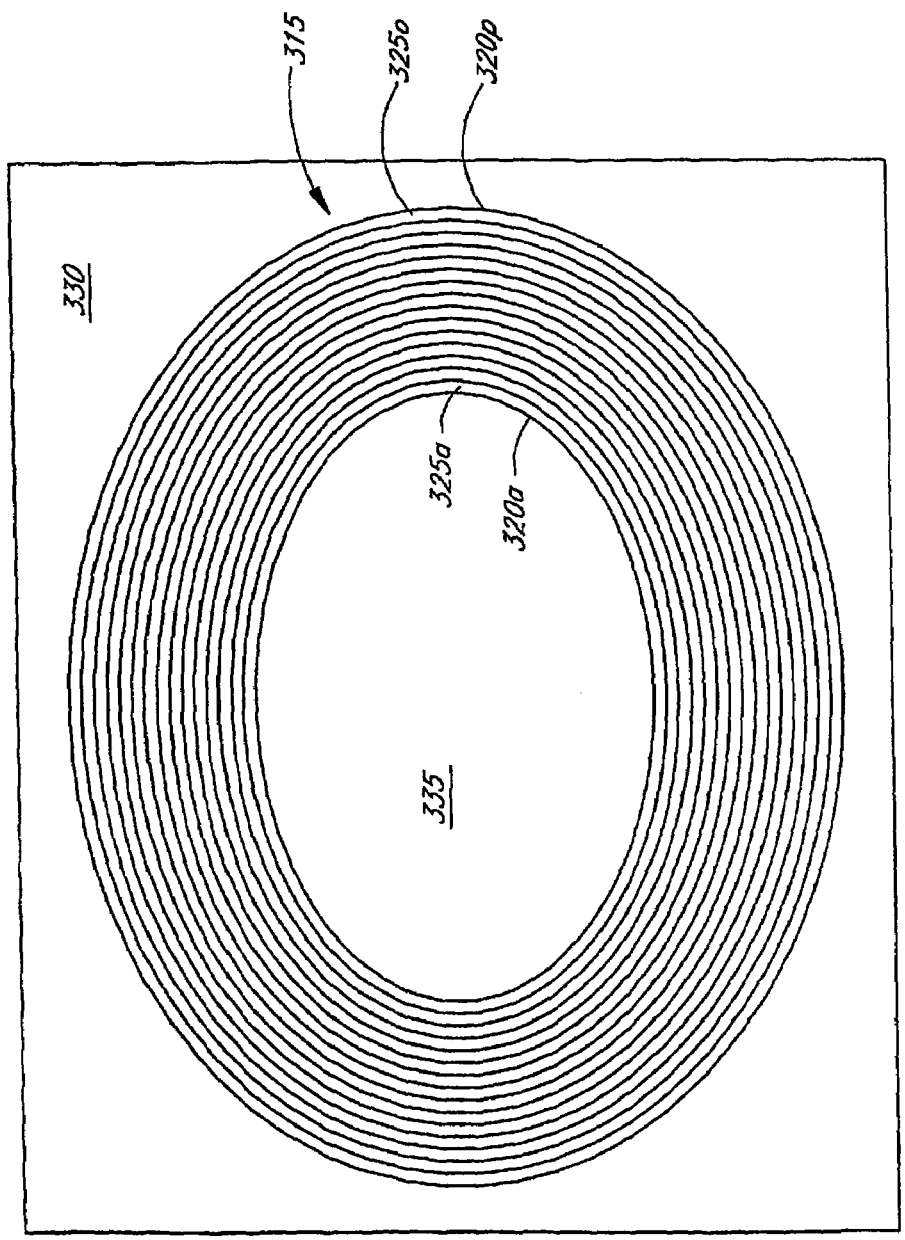
FIG. 18 is a is a enlarged view of one of the core laminations of FIG. 17.

An enlarged view of a single core array 315 is illustrated in FIG. 18 which shows an array having 16 concentric ferromagnetic electrically conductive metal rings 320a-320p insulated from each other by the respective etched out spaces or voids 325a-325o. Likewise, the area 330 outside the array 315 and the area 335 within the innermost ring 320 are void of magnetic material. This invention, however, is not limited to a concentric ring array and it will be apparent to those skilled in the art that other core arrays may be constructed such as a series of successively larger squares or rectangles insulated one from the other.

The next fabrication step is to stack a plurality of the PCB and FLEX layers 310 with the arrays 315 substantially in alignment. As shown in FIG. 19A, core arrays of concentric rings 315a-315h are stacked one on top of each other with the core patterns on each layer in alignment. The result is the fabrication of a plurality of high flux carrying metal cores having very small eddy current areas. Thus, the thickness of the original sheet used to etch the arrays 315 can be very thin, typically in the range of 0.0005" to 0.010" inches. The concentric rings can be etched using conventional PCB or FLEX (FPC) etching techniques to very narrow widths on the order of 0.002" to 0.003". As a result, referring to the cross-sectional eddy current producing areas of the core are very drastically reduced in size.

As part of the stacking process, a thin layer of dielectric material 340 is placed adjacent to the top surface of each etched concentric ring array 315. Typically, an epoxy material is used. This dielectric sheet and the dielectric sheet supporting the etched ferromagnetic rings may be of different materials. Representative materials include epoxies and acrylics manufactured by Dupont and Rogers Corp. for manufacturing of PCB boards and FLEX. Epoxies and prepregs (and epoxies with glass) are generally used to construct PCB boards and acrylics are generally used to manufacture FLEX. During the laminating process, the voids 325, voids 330 and voids 335 shown in FIG. 18 are filled with dielectric material 340 shown in FIGS. 21A and 21B.

As described above, the electrical windings of the embodiments of this invention are advantageously provided by conductive through hole vias in contact with printed circuitry on both sides of the core structures. The fabrication steps for windings of the embodiments of FIGS. 17-21 is shown in FIGS. 20A, 20B, 21A and 21B.

Referring to FIGS. 20A and 20B, additional layers of copper 350, 355 are respectively laminated on the top and bottom surfaces along with two additional layers of dielectrics 360, 365 separating the copper surfaces from the etched metal surfaces.

Figures 21A, 21B:
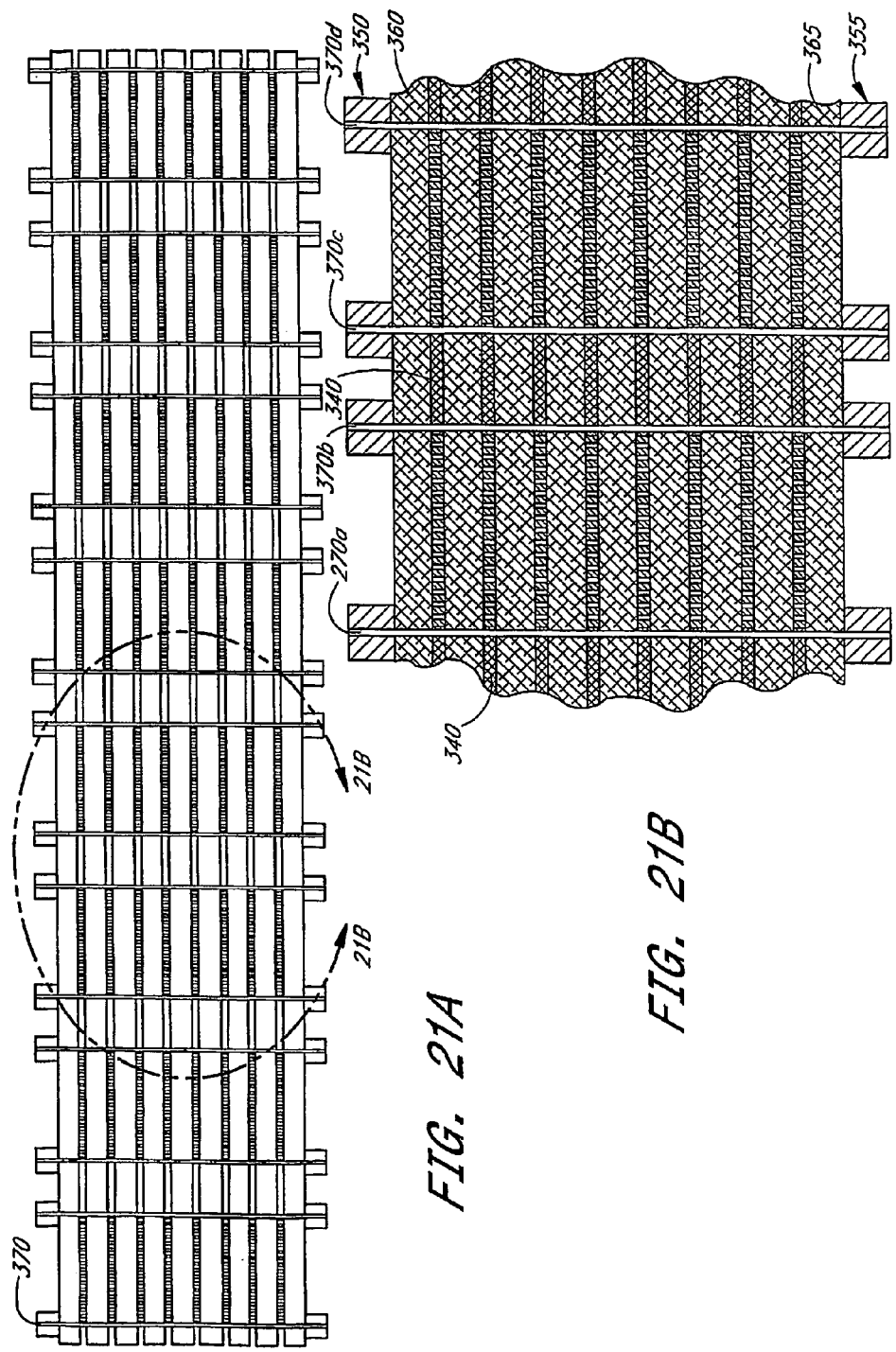
FIG. 21A is a cross-sectional view after plated through via holes have been drilled through the laminated structure of FIG. 20A.
FIG. 21B is an enlarged view of one of the core stacks of FIG. 21A.

The completed structure is illustrated in FIGS. 21A and 21B with via holes 370 drilled through the entire laminated array. These vias are located proximate to, but typically not in contact with the low resistivity ferromagnetic rings so as to electrically insulate the windings turns provided by the plated vias. These holes 370 are then plated with a electrically conductive material, typically copper. Conductive inks and conductive pastes within the via holes may also be employed. The copper layers 350, 355 are then etched to form circuit patterns in electrical contact with the plated through holes 370 for forming windings around the concentric ring core arrays 315.

The embodiment shown in FIGS. 21A and 21B illustrates, for simplicity of illustration, a small number of via holes 370a, 370b, 370c and 370d for each transformer. It will be apparent to those skilled in this art that the embodiments of FIGS. 17-21 can have multiple windings by adding additional through holes. If necessary, additional copper layers may be stacked on layers 350, 355 to provide the requisite connections to additional through holes.

Individual transformers and inductor devices are extracted from the laminated array of FIGS. 21A, 21B by the usual methods of "die" cutting or routing the parts from the array. Each such device can be used as a replacement for the traditional inductive devices shown in FIGS. 1 and 16. Also, because the etched metal core is part of an array such as shown in FIG. 19, it can be interconnected to other components.

Further Preferred Embodiments of Transformer/Inductor Devices having "Cell Cores"

Figure 22:
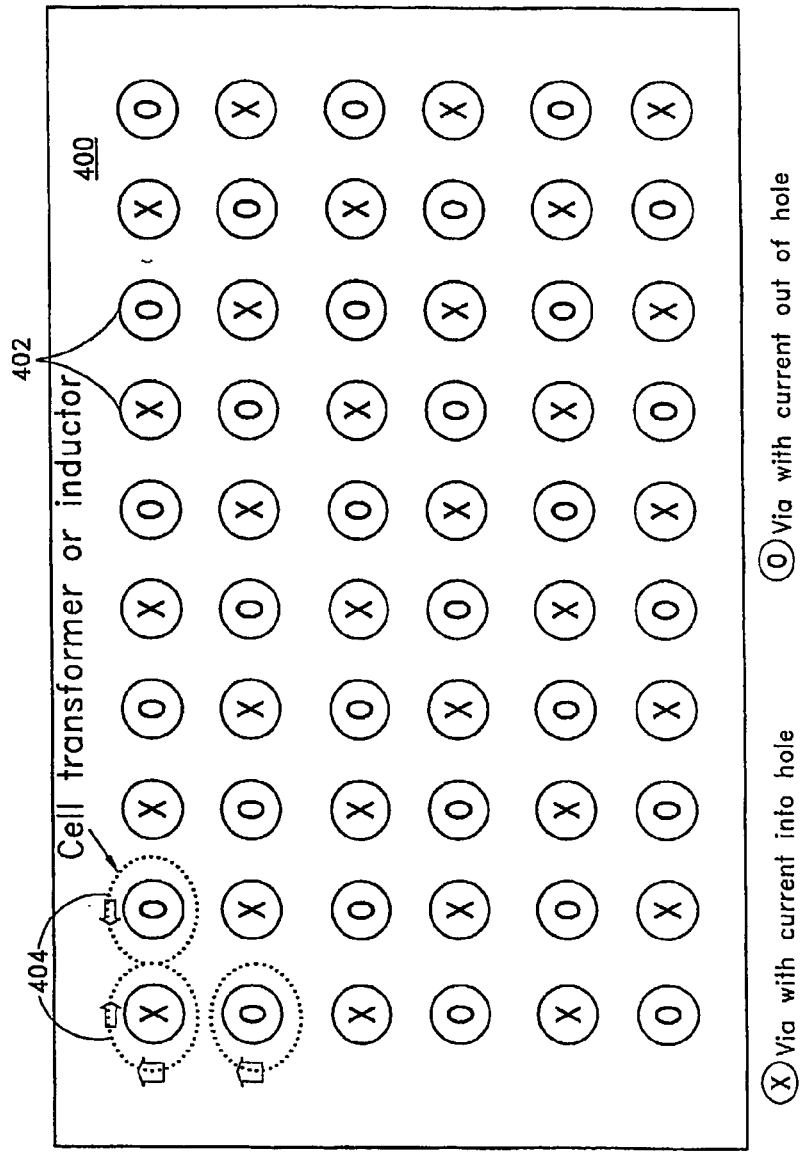
FIG. 22 is the top view of an array of 60 "cell cores" formed in a ferromagnetic slab and the resulting magnetic flux orientation for the alternating pattern of current flow.

FIG. 22 illustrates another embodiment of the present invention termed the "Cell Core" wherein one or more inductive devices are created from 60 vias 402 forming an array within a ferromagnetic slab 400. As indicated in FIG. 22, current passes either into or out of each via 402 in the array. The current may be carried by conductors (not shown) plated through and between the vias 402 as shown in FIG. 4B. As discussed below, each via 402 and a surrounding portion of the ferromagnetic slab 400 (as indicated by the dotted circles 404) creates a "cell core" which forms an inductive device either individually or in combination with one or more other cell cores.

FIG. 22 may be manufactured using the foregoing methods disclosed to manufacture virtual cores. For example, FIG. 22 may be manufactured as part of a FLEX as disclosed in the foregoing description of FIGS. 7, 8 and 9, as part of a PCB as disclosed in the foregoing description of FIGS. 10, 11 and 12, or without a FLEX or a PCB as disclosed in the foregoing description of FIG. 13.

Cell Core's Employment of Ampere's Law

Figure 23:
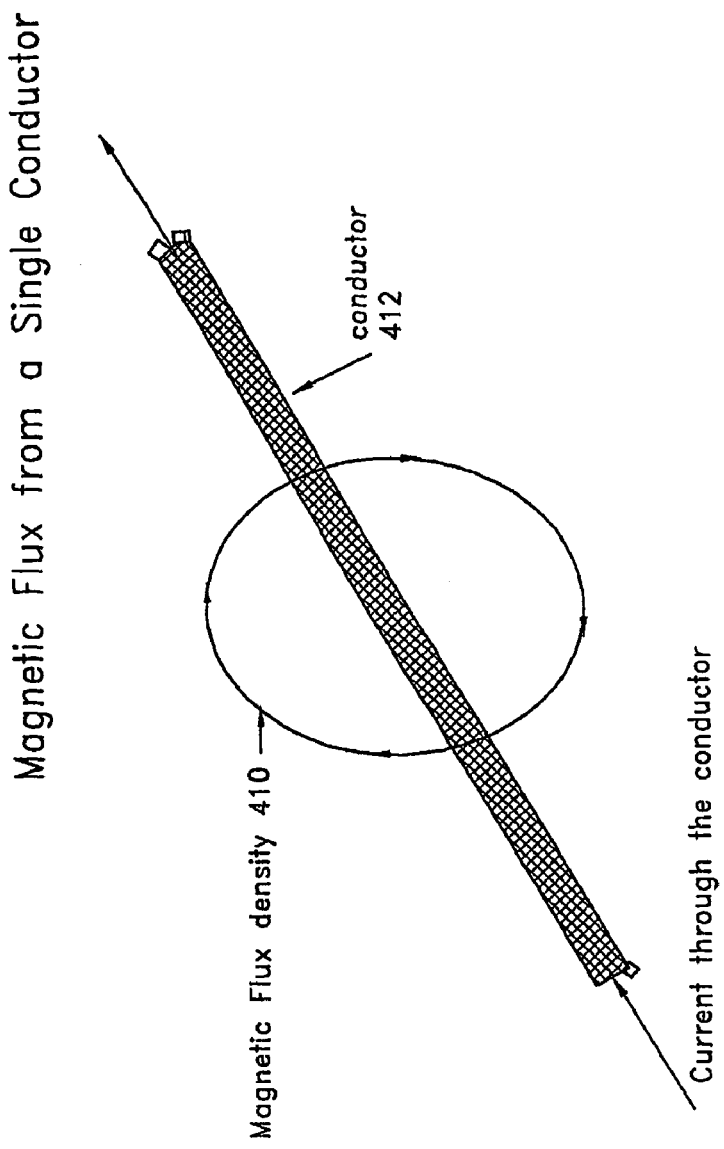
FIG. 23 shows the magnetic flux density generated by current passing through a straight conductor according to Ampere's Law.

According to Ampere's Law, each current carrying conductor passing through a via 402 in FIG. 22 will generate a circulating magnetic field as indicated by the dotted circles 404. While conventional inductive devices typically wind an insulated conductor around a ferrite toroid core to construct a "turn" passing through the central hole of the core, such windings or turns are not necessary to create a magnetic field of flux within the core. For example, FIG. 23 illustrates a form of Ampere's Law wherein a circulating magnetic field 410 is generated from current passing through a straight conductor 412. Thus, a curved conductor is not necessary to produce a magnetic field. However, the magnetic field path is dependent upon the current path. For example, a circular current path would create a straight field through the center of the current path.

Therefore, under Ampere's Law, an individual inductive device equivalent to a one turn inductor may be created by passing a single current carrying conductor through a via 402 in FIG. 22 to create a magnetic field within a portion of the ferromagnetic slab 400 proximally encompassing the via 402. As indicated by the dotted circles 404, the magnetic flux generated by a current carrying conductor is located in the immediate surrounding area of the ferromagnetic slab 400.

Cell Core's Employment of Faraday's Law

Figure 24:
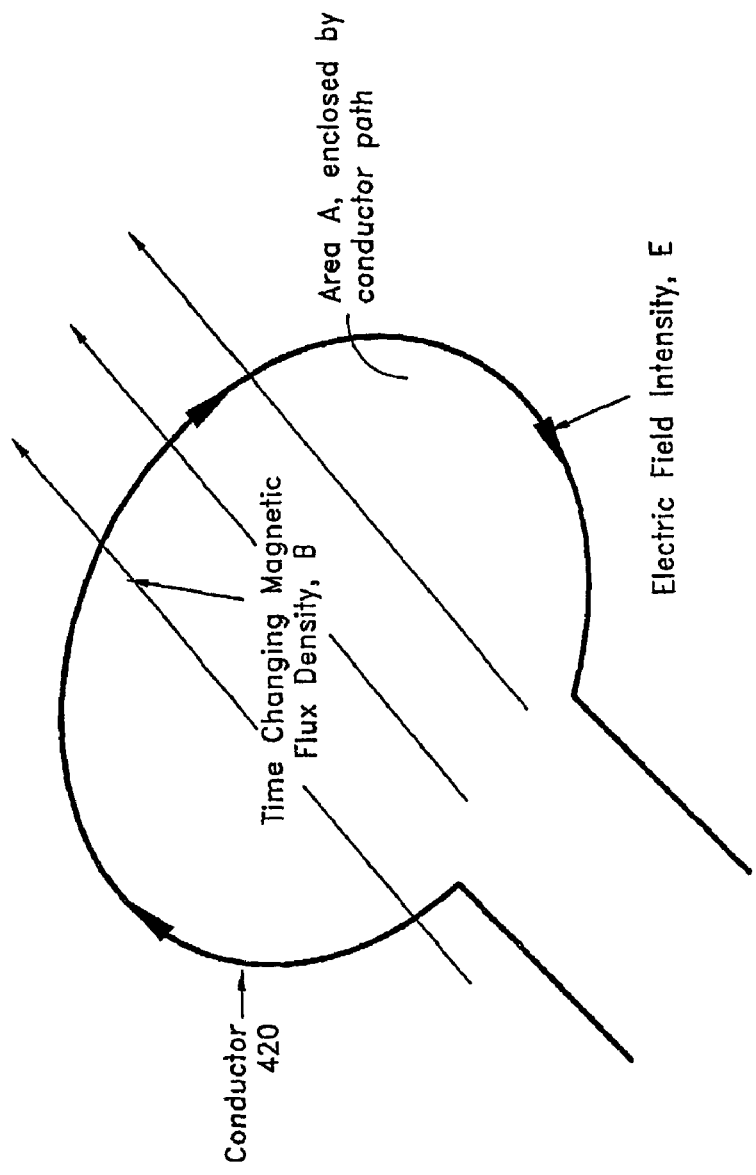
FIG. 24 shows the electric field intensity produced in a conductor when the path of the conductor encloses an area carrying time changing magnetic flux density according to Faraday's Law.

In another preferred embodiment of the present invention, placing a second insulated conductor through one or more vias 402 of FIG. 22 forms a transformer, referred to herein as a "cell core transformer" or "cell transformer." By way of illustration, FIG. 24 shows a form of Faraday's Law in which electric field intensity, E, is produced in a conductor 420 when the path of the conductor 420 encloses an area, A, carrying a time changing magnetic flux density, B. This law is described by the equation:

$$\oint E \cdot (dl) = \oint dB/dt \cdot (dA) \tag{Eq. 2}$$

which is the voltage induced when the line integral of the electric field intensity, E, around a closed path is equal to the sum of the time changing magnetic flux, B, intersecting the area, A, enclosed by the path.

Thus, in the embodiment shown in FIG. 22, the flux detected by a via's 402 secondary conductor is equal to the immediate surrounding flux created by the primary current within the same via 402. An individual inductive device equivalent to a 1-to-1 turns ratio transformer is created by passing a primary current carrying conductor and a secondary, or sensing, conductor through the same via 402 in FIG. 22. As described in detail below, the primary and secondary conductors of multiple vias 402 may be electrically coupled in series and parallel combinations to produce primary and secondary windings of a cell transformer with a desired turns ratio. As long as the polarity of the voltages induced are additive when combining the signals from each via 402, the composite winding will behave as part of a functioning transformer.

Figure 25:
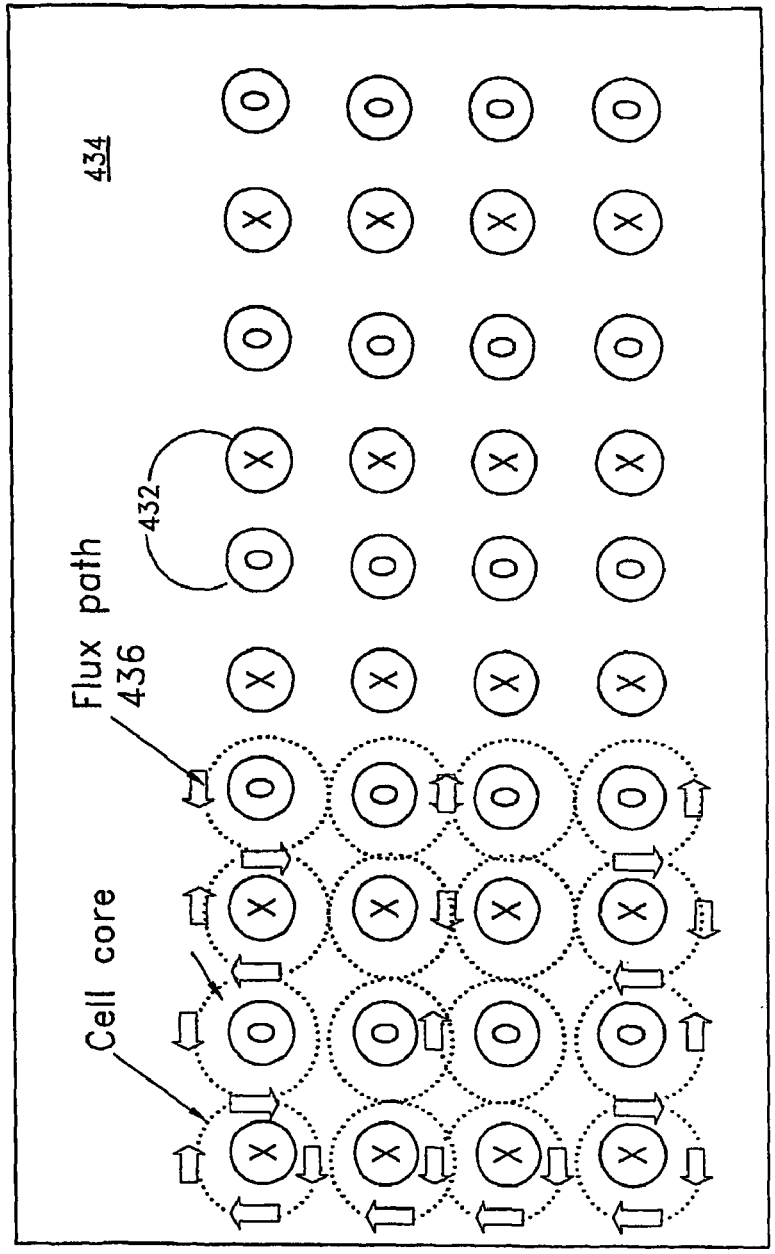
FIG. 25 is the top view of an array of 40 cell cores illustrating the magnetic flux orientation for the indicated pattern of current flow.
Figure 26:
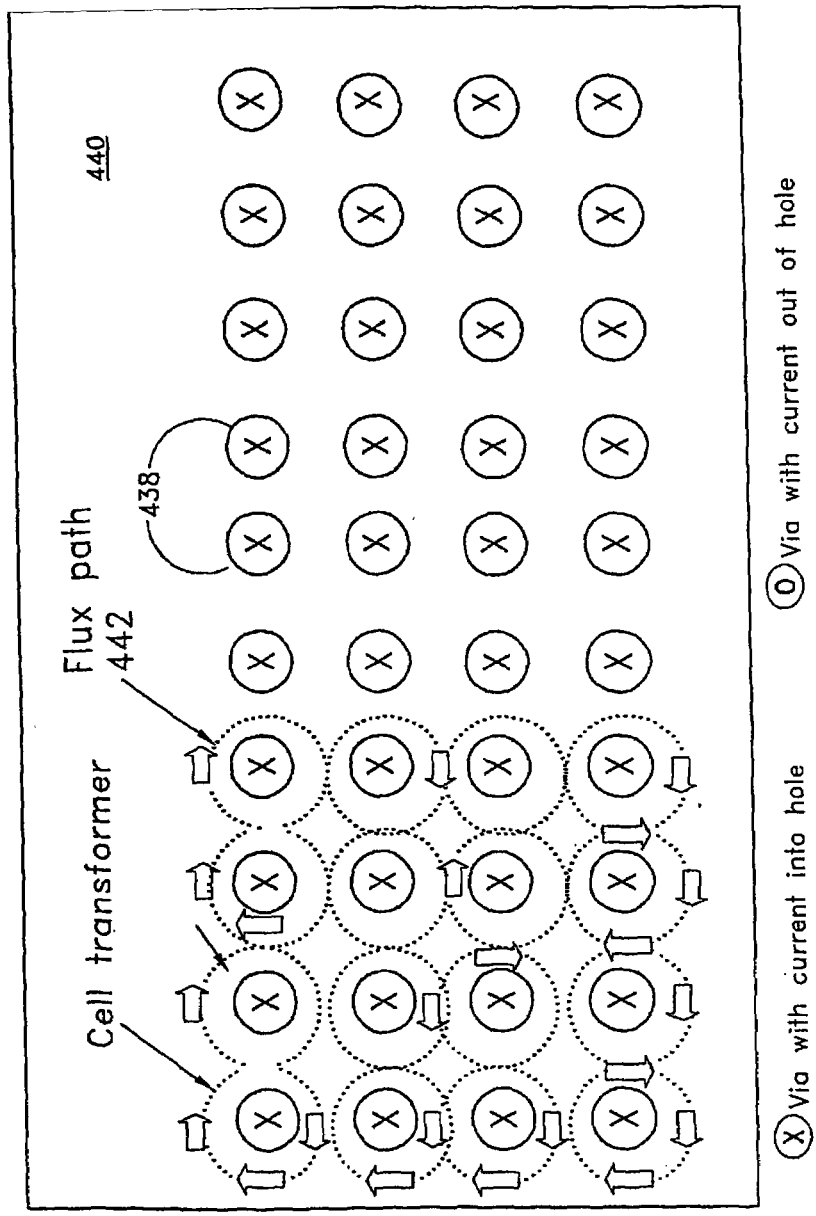
FIG. 26 is the top view of an array of 40 cell cores illustrating the magnetic flux orientation for a uniform pattern of current flow.

The pattern of current flow in FIG. 22 is arranged so that the current flowing in any single via 402 will be in the opposite direction from the current flowing in any adjacent via 402 in the same row or column of the array. The dotted circles 404, indicating the direction of the circulating magnetic flux around each via 402, illustrate that the resulting flux generated between each via 402 has the same orientation where two adjoining magnetic fields intersect. However, such an orientation is not necessary and various patterns of current flow are possible. For example, FIG. 25 illustrates an embodiment of the present invention wherein 40 vias 432 form an array within a ferromagnetic slab 434. The pattern of current flow as indicated in FIG. 25 is arranged so that the current is flowing in the same direction through each via 432 within a column and the current direction flowing through vias 432 in each column is in the opposite direction from any adjacent column. The dotted circles 436 illustrate that the resulting flux generated between two adjacent vias 432 in the same row has the same orientation, but the flux generated between two adjacent vias 432 in the same column has opposing orientations. FIG. 26 illustrates another embodiment of the present invention wherein the current flowing in each of the 40 vias 438 formed within the ferromagnetic slab 440 is in the same direction. The dotted circles 442 illustrate that the resulting flux generated between each via 438 has opposing orientations where the two adjoining magnetic fields intersect.

Regardless of the pattern of current flow, the magnetic flux generated by an individual via continues to be located in the proximate region of ferromagnetic material surrounding the via. Thus, a variety of patterns of current flow may be chosen to simplify the circuit paths when creating series and parallel combinations of windings.

Cell Core Combinations

Figure 27:
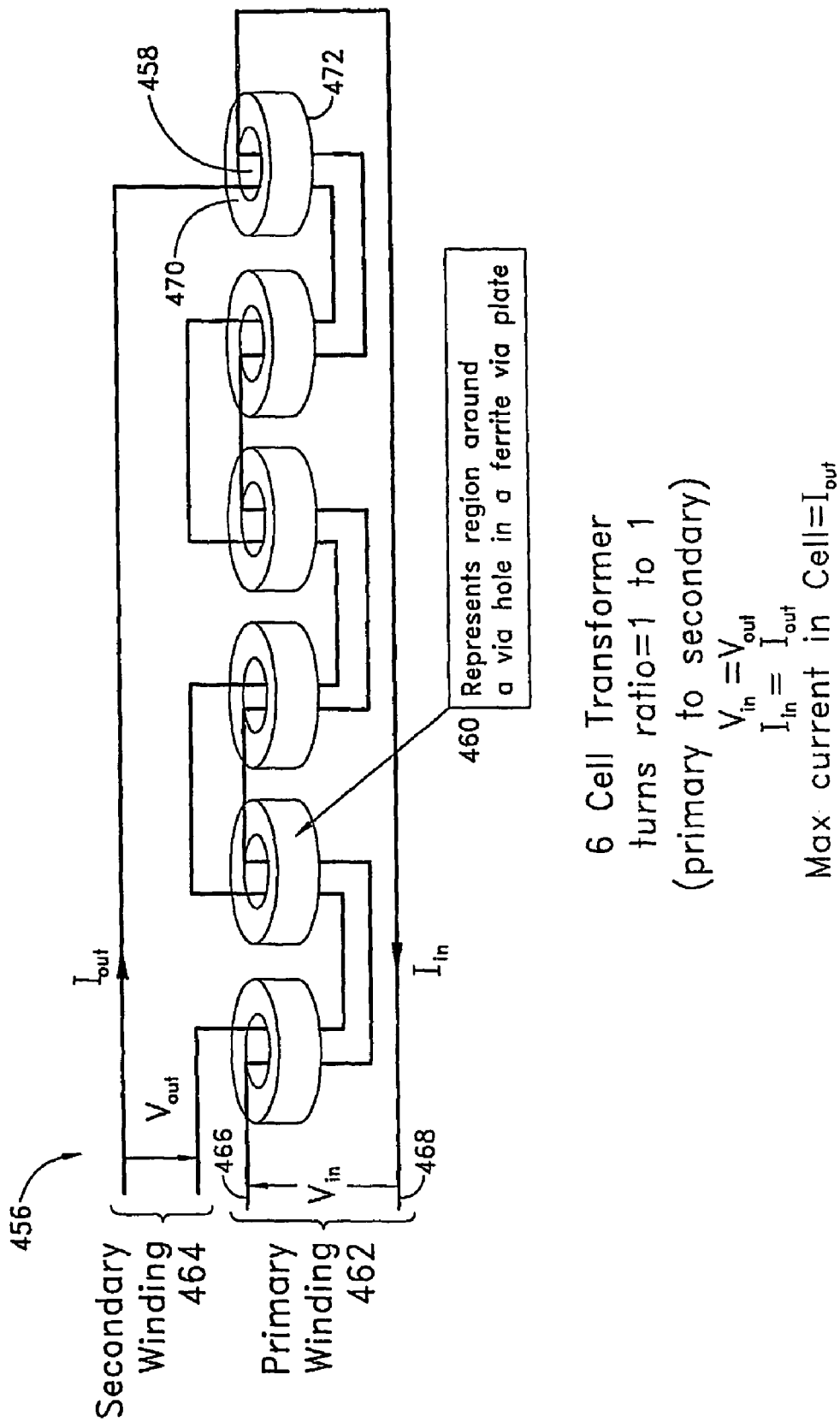
FIG. 27 is a schematic representation of primary and secondary windings passing through six cell cores to form a 1-to-1 turns-ratio transformer.

As discussed above, placing a second insulated conductor through a single via 402 of FIG. 22 will form a 1-to-1 turns-ratio cell transformer. Primary and secondary conductors within multiple vias 402 may also be combined in series and parallel to form cell transformers of any desired turns-ratio. FIG. 27 schematically illustrates an embodiment of the present invention wherein a six cell transformer 456 is created from six vias 458 formed in a ferromagnetic slab 460 (a portion of which is represented around each via 458). The cell transformer 456 includes a primary winding 462 providing a current path such that a voltage signal $V_{in}$ presented across the two ends 466, 468 of the primary winding 462 causes a current $I_{in}$ to flow from the first end 466 to the second end 468, passing through each via 458 in series. The cell transformer 456 also includes a secondary winding 464 providing a current path passing through each via 458 in series. The primary winding 462 and secondary winding 464 may comprise conductors (not shown) passing through and between the vias 458 on the top surface 470 and the bottom surface 472 of the ferromagnetic slab 460.

Since the primary winding 462 is in series, current $I_{in}$ flows through each via 458 and induces (as described above) a current equal to $I_{in}$ in that portion of the secondary winding 464 passing through each via 458. Since the secondary winding 464 is also in series, the maximum current in the secondary winding 464 passing through each via 458 is $I_{out}$, which equals $I_{in}$. Therefore, $V_{out}$ equals $V_{in}$ and the six cell transformer of FIG. 27 has a 1-to-1 turns-ratio.

Figure 28:
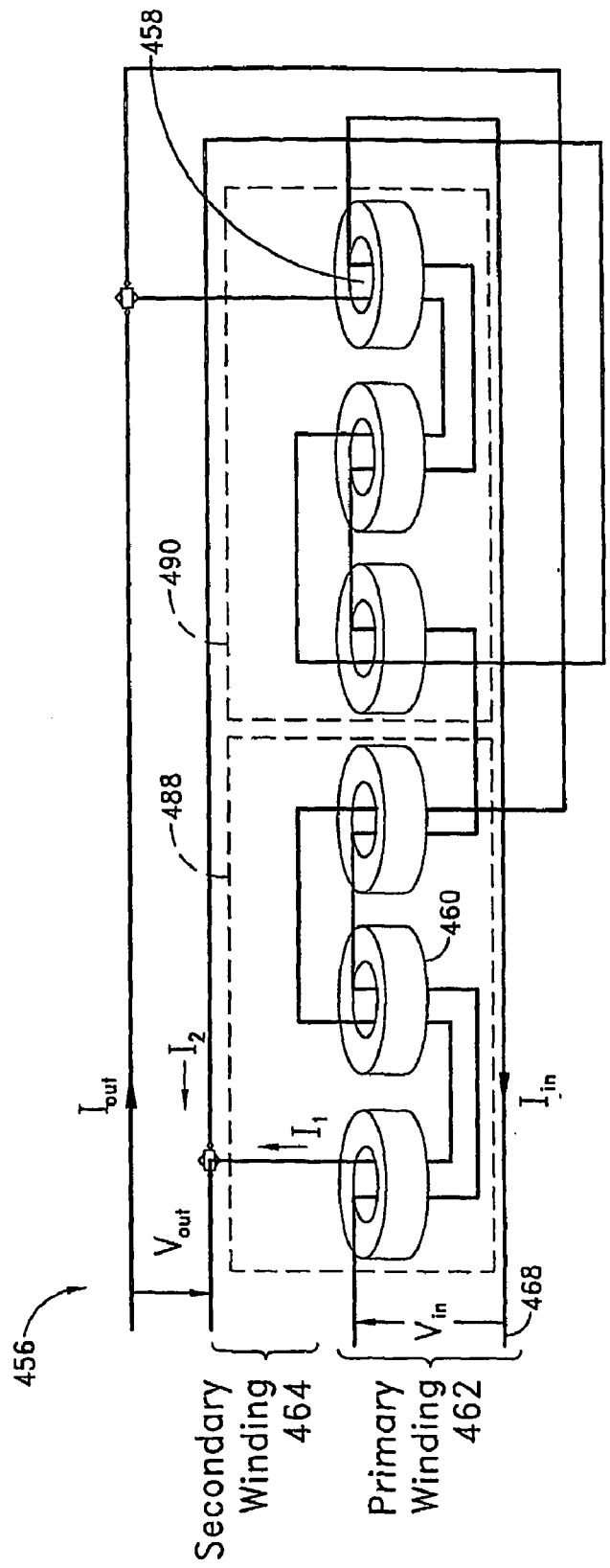
FIG. 28 is a schematic representation of primary and secondary windings passing through six cell cores to form a 2-to-1 turns-ratio transformer.

FIG. 28 schematically illustrates another embodiment of the present invention wherein the secondary winding 464 of the six cell transformer 456 of FIG. 27 has been rearranged to provide a current path passing in parallel through two via groups 488, 490, wherein the current path through each group 488, 490 passes through three vias 458 in series. A current equal to $I_{in}$, is induced in that portion of the secondary winding 464 passing through each via 458, causing both currents $I_1$ and $I_2$ to be equal to $I_{in}$. Therefore, under Ohm's Law and the Conservation of Energy, $I_{in}$ equals $I_{out}$ divided by two and $V_{in}$ equals $V_{out}$ multiplied by two. The resulting cell transformer has a 2-to-1 turns-ratio (primary to secondary) wherein the maximum current passing through each via 458 in the secondary winding 464 is equal to one-half of $I_{out}$.

Figure 29:
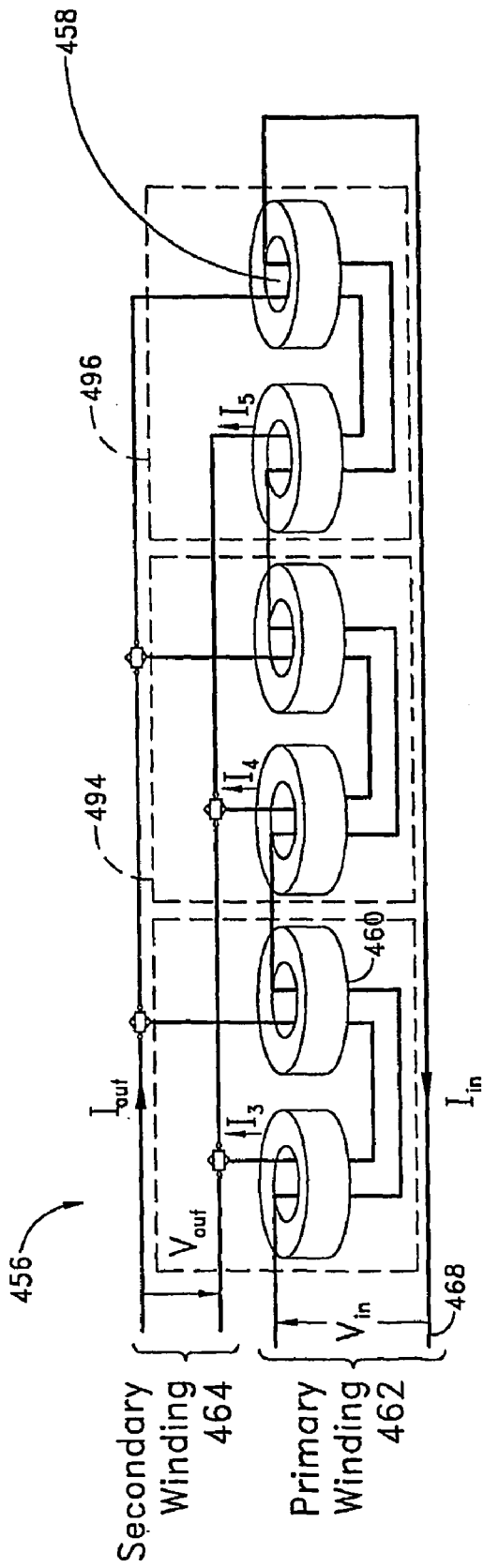
FIG. 29 is a schematic representation of primary and secondary windings passing through six cell cores to form a 3-to-1 turns-ratio transformer.

FIG. 29 schematically illustrates yet another embodiment of the present invention wherein the secondary winding 464 of the six cell transformer 456 of FIG. 27 has been rearranged to provide a current path passing in parallel through three via groups 492, 494, 496, wherein the current path through each group 492, 494, 496 passes through two vias 458 in series. A current equal to $I_{in}$ is induced in that portion of the secondary winding 464 passing through each via 458, causing currents each current $I_3$, $I_4$ and $I_5$ to equal $I_{in}$. Therefore, $I_{in}$ equals $I_{out}$ divided by three and $V_{in}$ equals $V_{out}$ multiplied by three. The resulting cell transformer has a 3-to-1 turns-ratio (primary to secondary) wherein the maximum current passing through each via 458 in the secondary winding 464 is equal to one-third of $I_{out}$.

Figure 30:
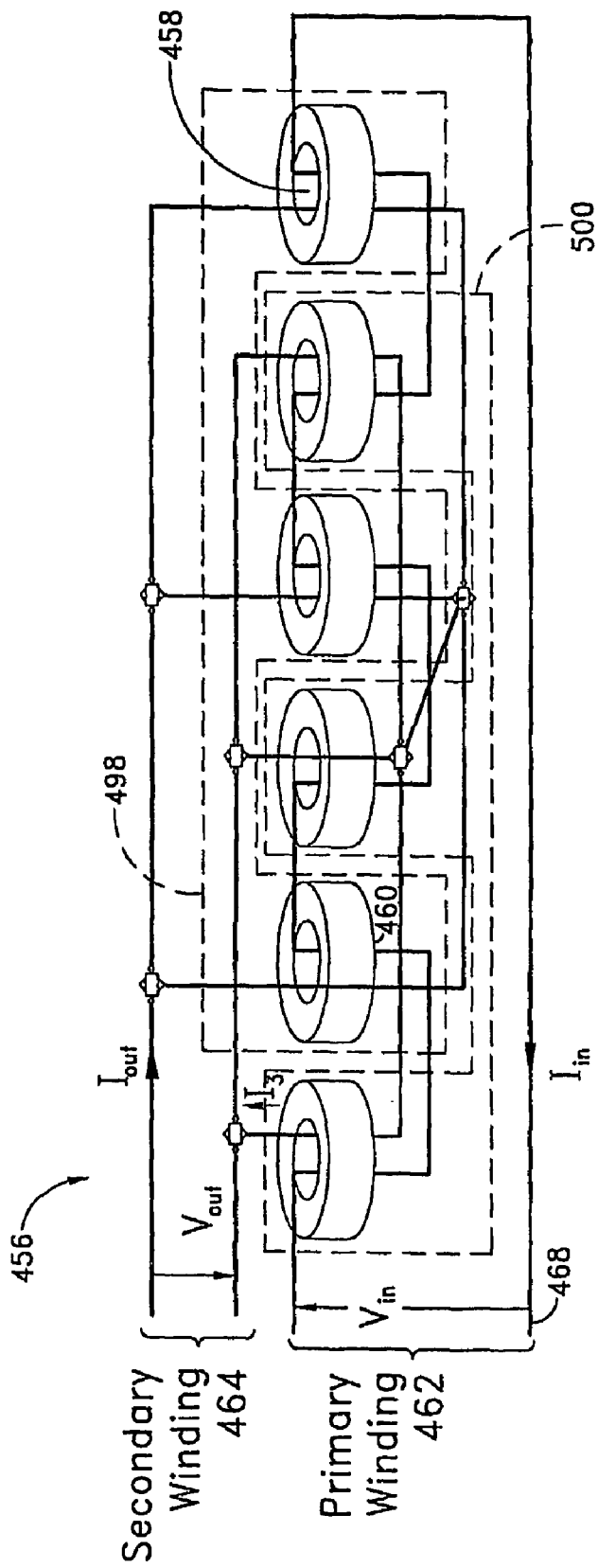
FIG. 30 is a schematic representation of primary and secondary windings passing through six cell cores to form a 3-to-1 turns-ratio transformer, wherein the secondary winding has been rearranged from that shown in FIG. 29.

FIG. 30 schematically illustrates yet another embodiment of the present invention wherein the secondary winding 464 of the six cell transformer 456 of FIG. 27 has been rearranged to provide a current path passing in series through two via groups 498, 500, wherein the current path through each group 498, 500 passes through three vias 458 in parallel. This configuration produces the same result as the secondary winding 464 configuration used in FIG. 29 above, illustrating that many different winding configurations can achieve the same result.

Figure 31:
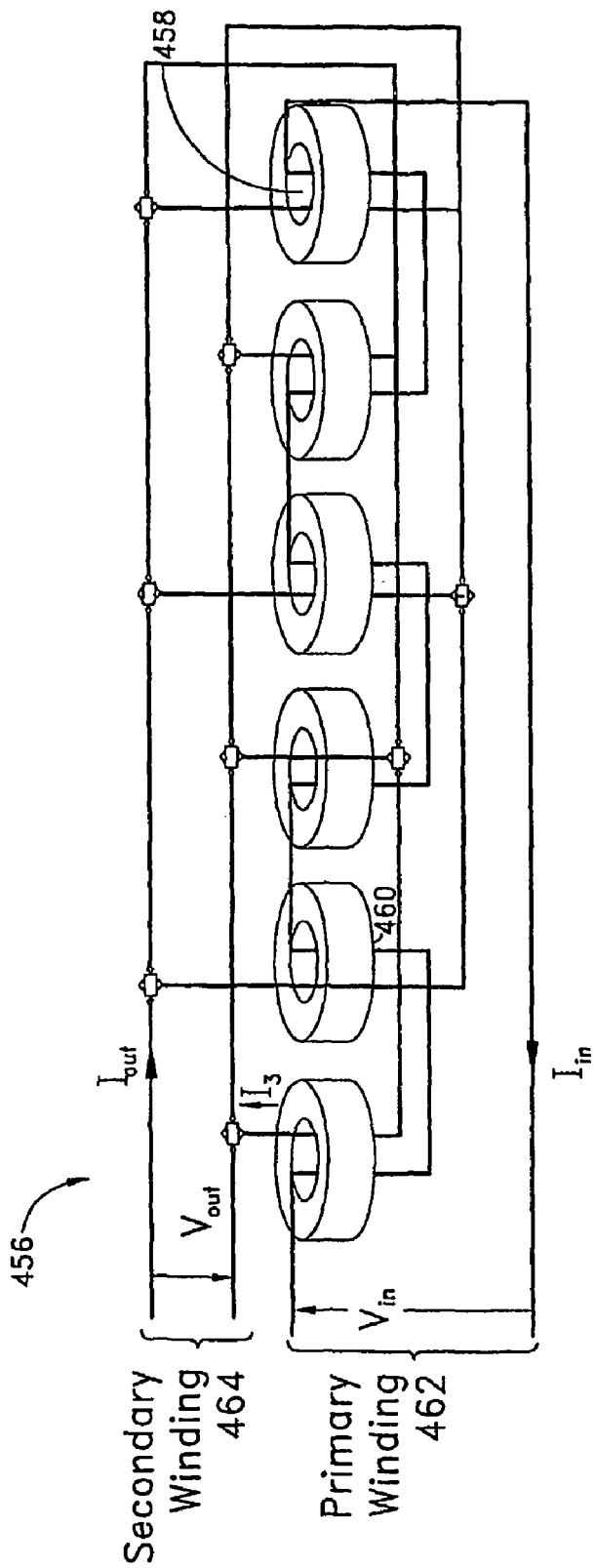
FIG. 31 is a schematic representation of primary and secondary windings passing through six cell cores to form a 6-to-1 turns-ratio transformer.

FIG. 31 schematically illustrates yet another embodiment of the present invention wherein the secondary winding 464 of the six cell transformer 456 of FIG. 27 has been rearranged to provide a current path passing in parallel through all six vias 458. Using the same principles under Ohm's Law and the Conservation of Energy as above, $I_{in}$ equals $I_{out}$ divided by six and $V_{in}$ equals $V_{out}$ multiplied by six. The resulting cell transformer has a 6-to-1 turns-ratio (primary to secondary) wherein the maximum current passing through each via 458 in the secondary winding 464 is equal to one-sixth of $I_{out}$.

FIGS. 32A-32I use a symbolic representation of the primary winding 462 and secondary winding 464 of the six cell transformer 456 of FIG. 27 to illustrate further embodiments of the present invention having a variety of turns-ratios. The filled arrow symbols 512 shown in both the primary 462 and secondary 464 windings represent the orientation of the each winding as it passes through a via. Series connections 514 and parallel connections 516 between filled arrow symbols 512 illustrate, by way of example only, various combinations of passing primary 462 and secondary 464 windings through the six vias 458 of FIG. 27 to create desired turns-ratios.

The foregoing embodiments of the six cell transformer 456 of the present invention are not limited to those illustrated in FIGS. 27-32I. As shown in Table 1 below, there are 36 combinations of connections possible for the six cell transformer 456 of FIG. 27, although not every combination is balanced. As used herein, a "balanced" cell transformer has the same amount of current passing through each via. Table 1 shows a total of sixteen possible balanced configurations (shown highlighted in gray), ten of which are unique combinations (underlined).

TABLE 1

Possible Winding Combinations of a
Six Cell Transformer and Equivalent Turns-ratios

| Primary Winding | Secondary Winding | | | | | |
|---|---|---|---|---|---|---|
| | 6 in Series | 5 in Series 1 Parallel | 4 in Series 2 Parallel | 3 in Series 3 Parallel | 2 in Series 4 Parallel | 6 in Parallel |
| 6 in Series | 6-to-6 | 6-to-5 | 6-to-4 | 6-to-3 | 6-to-2 | 6-to-1 |
| 5 in Series 1 Parallel | 5-to-6 | 5-to-5 | 5-to-4 | 5-to-3 | 5-to-2 | 5-to-1 |
| 4 in Series 2 Parallel | 4-to-6 | 4-to-5 | 4-to-4 | 4-to-3 | 4-to-2 | 4-to-1 |
| 3 in Series 3 Parallel | 3-to-6 | 3-to-5 | 3-to-4 | 3-to-3 | 3-to-2 | 3-to-1 |
| 2 in Series 4 Parallel | 2-to-6 | 2-to-5 | 2-to-4 | 2-to-3 | 2-to-2 | 2-to-1 |
| 6 in Parallel | 1-to-6 | 1-to-5 | 1-to-4 | 1-to-3 | 1-to-2 | 1-to-1 |

The present invention is not limited to six cell transformers 456 as disclosed in the foregoing descriptions of FIGS. 27-32I. Any number of vias may be used to form a cell transformer with the desired turns-ratio. As the numbers of vias are increased, the number of winding combinations dramatically increases, allowing a wide variety of turns-ratios, inductance and configurations to facilitate design requirements. For example, an array of 20 cell cores formed in a ferromagnetic slab would create 400 different configurations, 36 being balanced and 21 being totally unique.

Cell Core Power Transformers

Figure 33A:
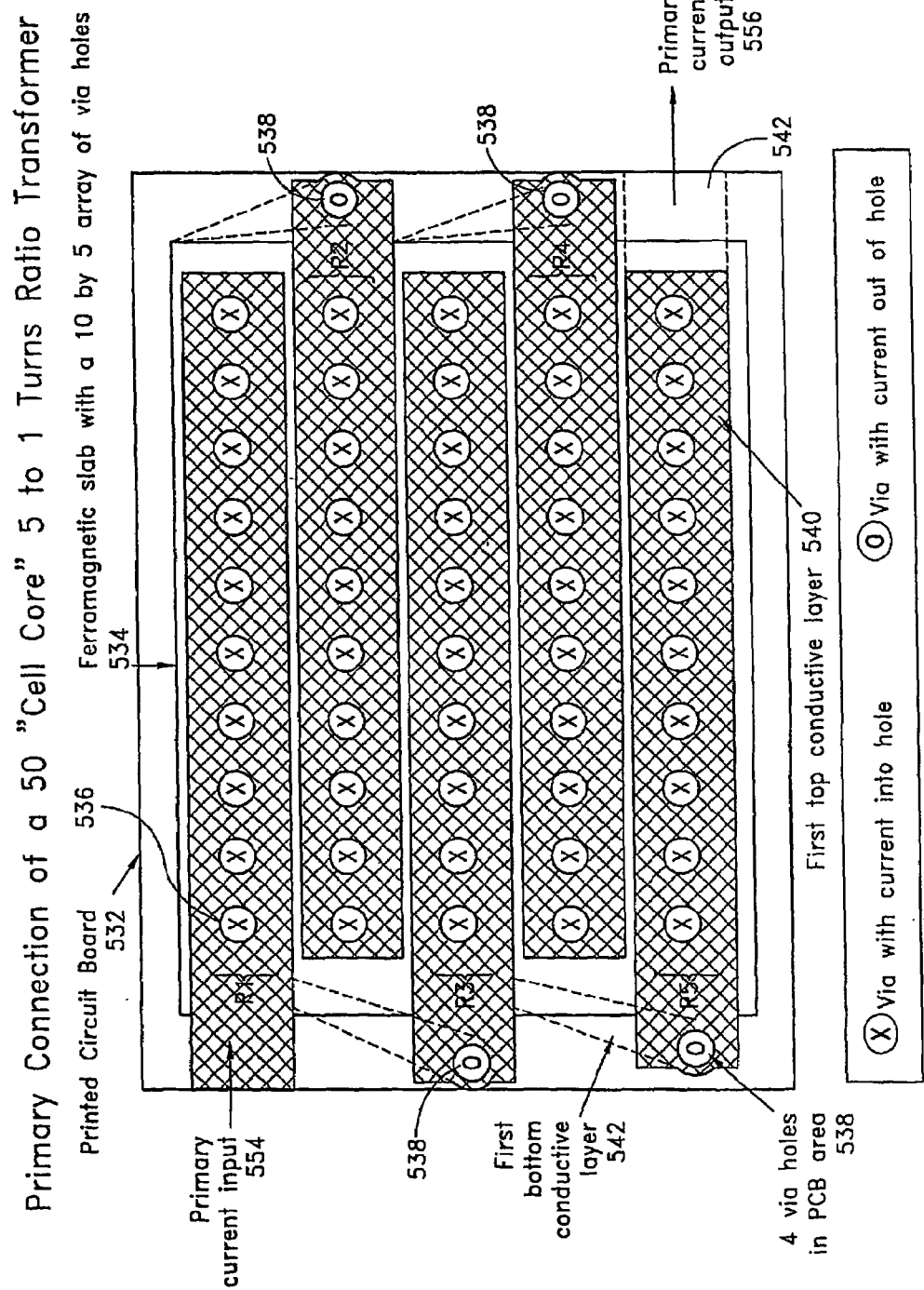
FIG. 33A is the top view of a first top conductive layer of a cell core power transformer to illustrate the electrical connection between primary conductors passing through each via in the array of 50 vias.
Figure 33B:
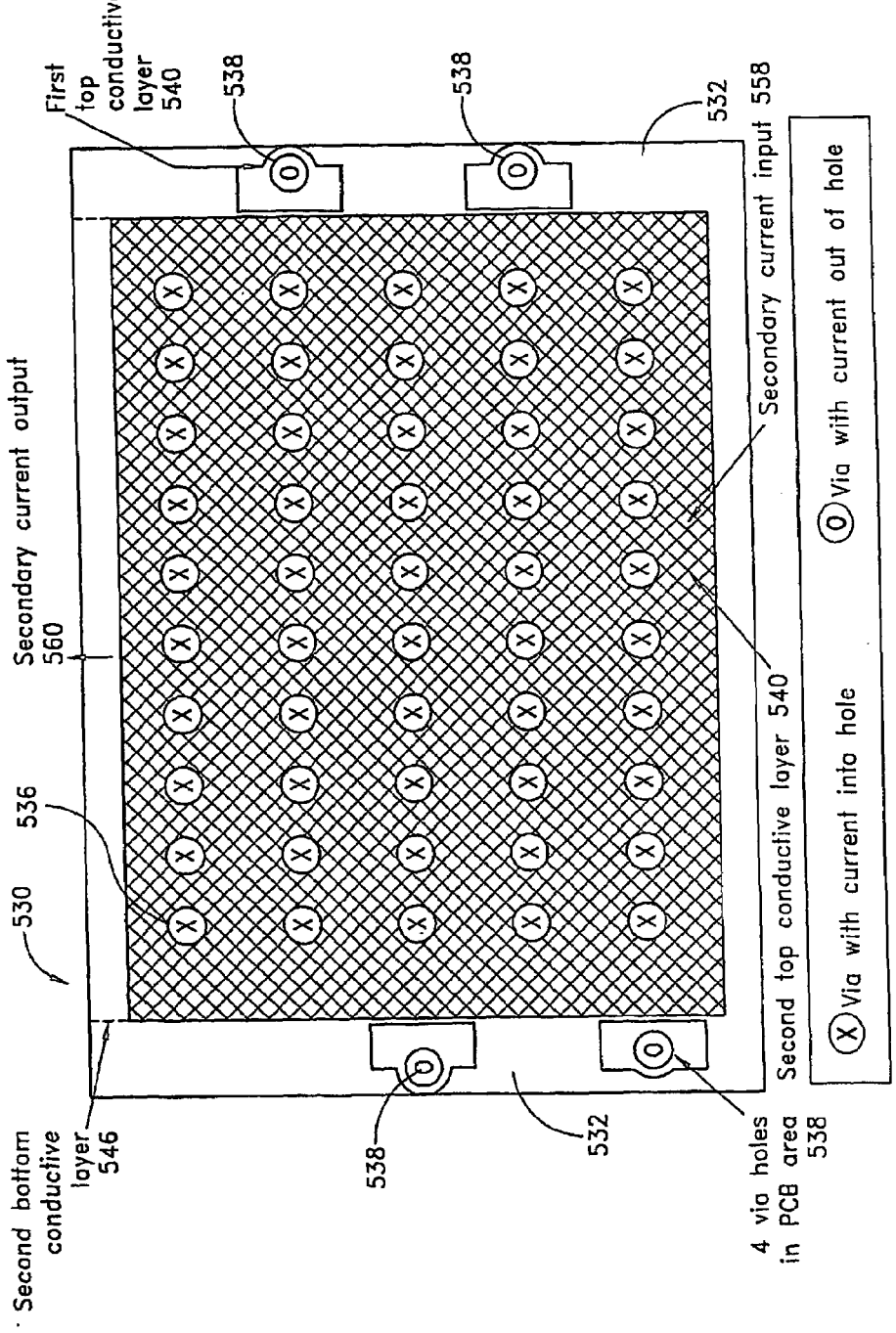
FIG. 33B is the top view of a second top conductive layer of the cell core power transformer of FIG. 33A to illustrate the parallel electrical connection between secondary conductors passing through each via in the array of 50 vias.
Figure 33C:
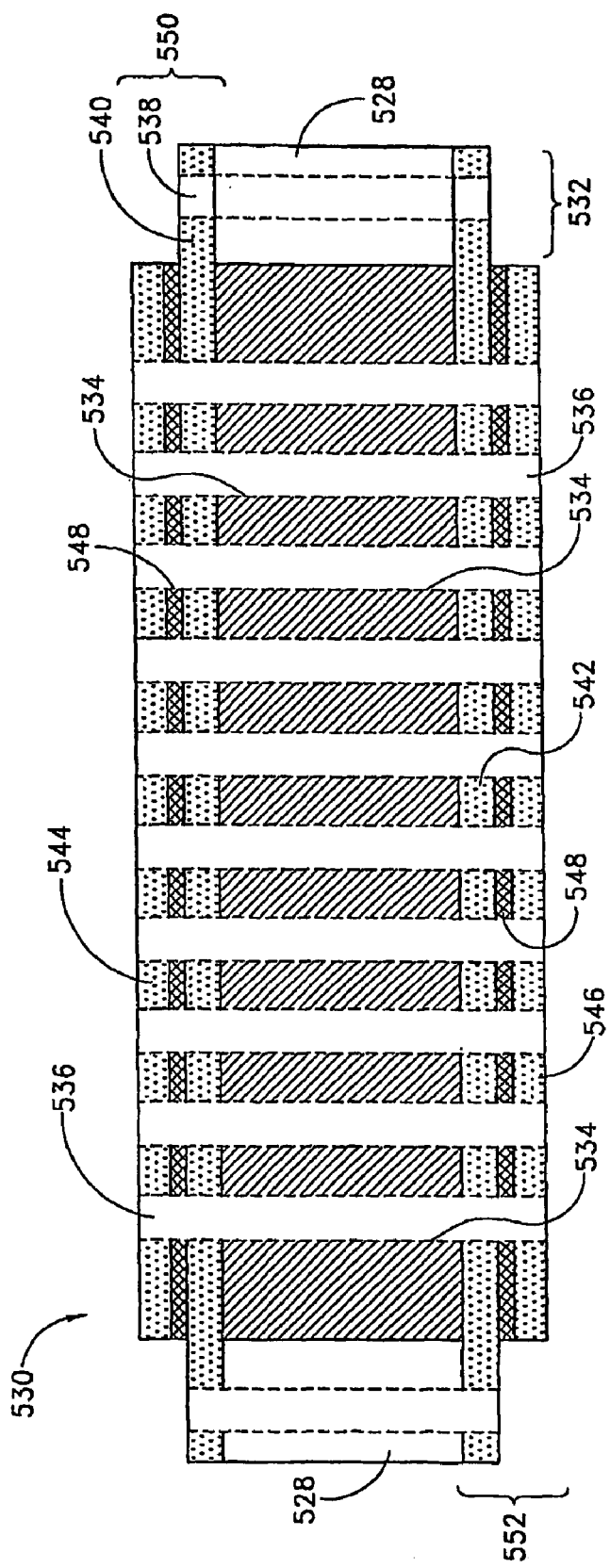
FIG. 33C is a cross-sectional side view of the cell core power transformer of FIG. 33A.

In power supply and other high secondary current applications, the uniformity of the current pattern shown in FIG. 26 advantageously simplifies both the primary winding connection as well as the high current secondary winding connection where most or all of the cell cores are connected in parallel. FIGS. 33A, 33B and 33C show an embodiment of a cell core power transformer 530 comprising a ferromagnetic slab 534 embedded in a PCB adhesive 528. By way of example only, the cell core power transformer 530 of FIGS. 33A, 33B and 33C is configured to have a 5-to-1 turns-ratio and a secondary output current of 50 amperes. Due to the cost and extensive time necessary to plate a conductor that can carry more than one ampere through a via, it is normally necessary to limit the current in each via to no more than one ampere. As described below, the 50 vias 536 shown in FIGS. 33A, 33B and 33C are connected in parallel to provide 50 amperes of secondary current output with a maximum of one ampere passing through a secondary conductor in each via 536.

Referring to FIGS. 33A, 33B and 33C, 50 vias 536 pass through the top PCB composite layers 550, ferromagnetic slab 534 and bottom PCB composite layers 552 to form an array having five rows. For purposes of discussion, the rows have been labeled R1 through R5 in FIG. 33A. Each of the 50 vias 536 may include a primary conductor (not shown) and a secondary conductor (not shown) which are insulated from one another. Four plated vias 538 pass through a PCB area 532 that does not contain the ferromagnetic slab 534. For clarity, ten vias 536 passing through the ferromagnetic slab and two vias passing through the PCB area 532 are shown in the cross-sectional side view of FIG. 33C. The top PCB circuitry 550 comprises a first top conductive layer 540 and a second top conductive layer 544 separated by an insulation layer 548. The bottom PCB circuitry 552 comprises a first bottom conductive layer 542 and a second bottom conductive layer 546 separated by an insulation layer 548.

FIG. 33A shows a top view of the cell core power transformer 530 with the second top conductive layer 544 and insulation layer 548 removed to expose the first top conductive layer 540. A portion of the first top conductive layer 540 forms an electrical connection between the primary conductors of each via 536 in row R1 on one side of the ferromagnetic slab 534 and a portion of the first bottom conductive layer 542 forms an electrical connection between the primary conductors of each via 536 in row R1 on the other side of the ferromagnetic slab 534. Thus, all ten primary conductors in row R1 are connected in parallel between a portion of the first top conductive layer 540 and a portion of the first bottom conductive layer 542. Similarly, the primary conductors of each via 536 are connected in parallel along each of rows R2 through R5. Further, the vias 538 located in the PCB area 532 are electrically connected to portions of the first top conductive layer 540 and the first bottom conductive layer 542 so as to create a series connection between rows R1 through R5. As indicated in FIG. 33A, the primary current flowing through each via 536 in the array is in the same direction.

FIG. 33B shows a top view of the cell core power transformer 530. The second top conductive layer 544 forms an electrical connection between the secondary conductors of each via 536 on one side of the ferromagnetic slab 534 and the second bottom conductive layer 546 forms an electrical connection between the secondary conductors of each via 536 on the other side of the ferromagnetic slab 534. Thus, all 50 secondary conductors are connected in parallel between the second top conductive layer 544 and the second bottom conductive layer 546.

Referring to the operation of the cell core power transformer illustrated in FIGS. 33A, 33B and 33C, a ten-ampere primary current applied at node 554 will pass through each via 536 in row R1 in parallel. Thus, each via 536 will conduct only one ampere of primary current as it passes from a portion of the first top conductive layer 540 to a portion of the first bottom conductive layer 542 in row R1. Ten amperes of primary current will then pass from the portion of the first bottom conductive layer 542 on row R1 to a portion of the first top conductive layer 540 on row R2 through a via 538 in the PCB area 532. In this manner, the ten amperes of primary current pass from node 554 in row R1 to node 556 in row R5, passing to each succeeding row in series through the four vias 538 in the PCB area and through each via 536 in each row in parallel such that all 50 vias 536 carry one ampere of primary current through the ferromagnetic slab 534. In order to carry ten amperes of current, the four vias 538 in the PCB area 532 may comprise, by way of example only, an enlarged slot, multiple vias, solid high current carrying pins, a single thick wire or multiple wires.

The one ampere of primary current passing through each via 536 will induce a secondary current of one ampere in the secondary conductors passing through each via 536. Since the secondary conductors of each via 536 are connected in parallel between the second top conductive layer 544 and the second bottom conductive layer 546, 50 amperes of secondary current will flow from node 558 in the second top conductive layer 544 to node 560 in the second bottom conductive layer 546. Therefore, cell core power transformer 530 has a 5-to-1 turns-ratio with a secondary current of 50 amperes.

The embodiment shown in FIGS. 33A, 33B and 33C has an extremely simple arrangement and minimizes the resistance of both the primary and secondary windings. The high current secondary resistance is very low because both the second top conductive layer 544 and the second bottom conductive layer 546 advantageously comprise a plane of conductive material, such as copper. Also, the primary and secondary conductors in each via 536 tend to have equal currents due to virtually identical path lengths through each via 536. Further, the input and output connections to the primary winding (represented by nodes 554 and 556) and secondary winding (represented by nodes 558 and 560) are conveniently arranged.

Virtual and Cell Core Combinations

The embodiment shown in FIGS. 33A, 33B and 33C, which uses the current orientation shown in FIG. 26, can be easily altered to achieve many different specifications of output current and turns-ratio. The uniformity of the current pattern shown in FIG. 26 may also be used advantageously in combination with virtual core arrangements to form transformers comprising two or more secondary windings. Cell cores with two or more secondary conductors passing through a single via may be very difficult and expensive to manufacture. However, vias with additional secondary conductors may be arranged proximate a cell core in order to sense the encircling magnetic flux flowing within the ferromagnetic material surrounding the cell core. For example, as discussed in the foregoing description of FIGS. 33A, 33B and 33C, each via 536 within the ferromagnetic slab 534 has one primary and one secondary current carrying conductor formed therein, the primary conductor inducing a secondary current in the secondary conductor. One or more additional secondary windings may be coupled to the primary conductor by forming plated vias in the areas of the ferromagnetic slab 534 where the flux appears to flow beyond the immediate region around the cell core, for instance, at the outer perimeter of the array.

ADVANTAGES OF THE EMBODIMENTS

Figure 1:
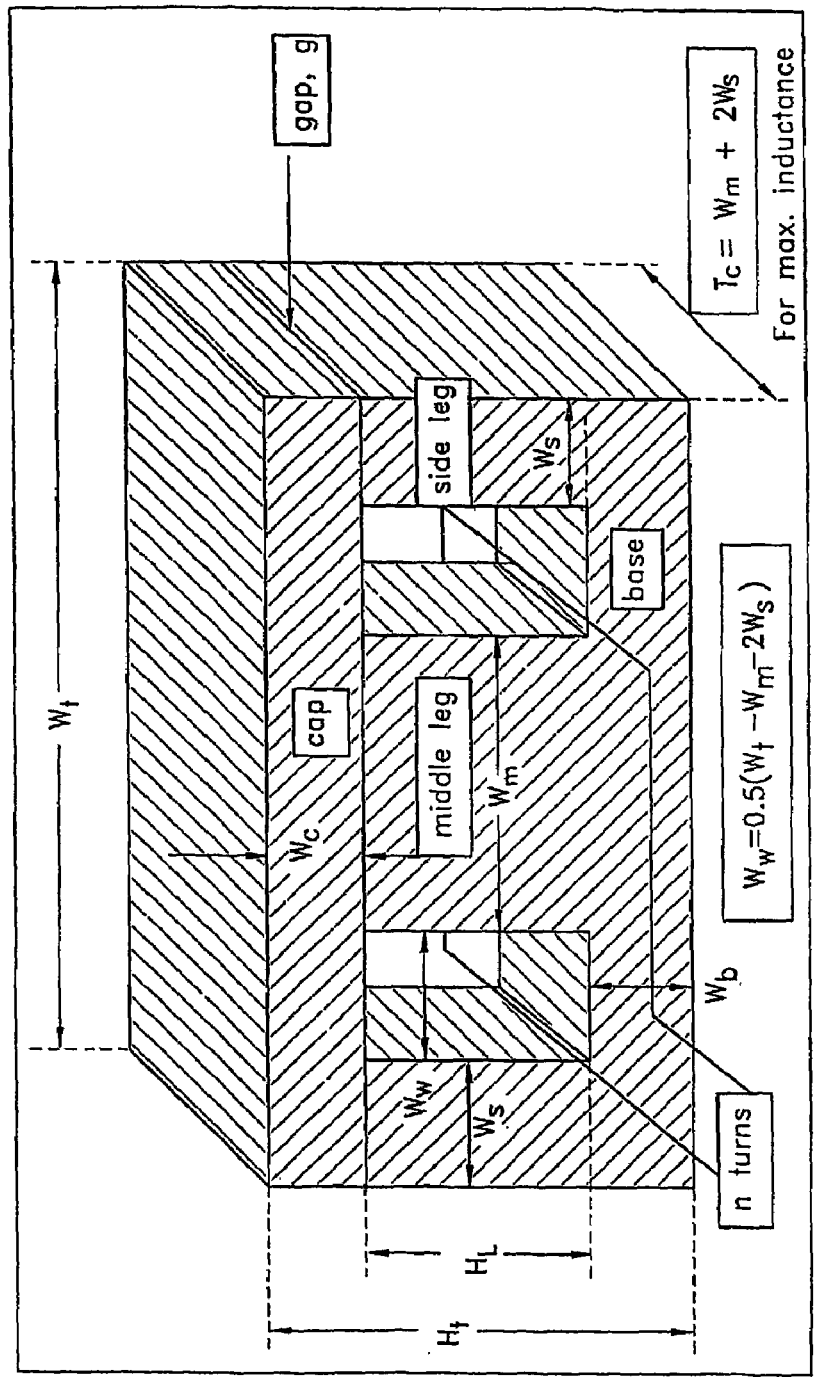
FIG. 1 is a conceptual illustration of a prior art ferromagnetic E core, with a matching ferromagnetic cap.

One Piece Core:

In E core construction, as shown in FIG. 1, a gap forms between the E core and the cap. Most transformers use an E type core that requires one half of the core be joined to the other using, for example, epoxies and clamps. These processes are time-consuming, introduce losses, and cause variances in the parameters of the devices due to the resulting gap between the E core and the cap. In contrast, the cores disclosed herein advantageously comprise a continuous piece, thereby providing improved transformer efficiency. The one-piece design also eliminates the need to join two separate pieces together in a separate processing step.

If an intentional gap is desired in the embodiments of FIGS. 17-21 to avoid magnetic saturation, a separation can be etched in each of the concentric rings shown in FIG. 18. Such etched gap rings eliminate the large variations of the traditional mechanical separation of the E cores.

Reduction of Eddy Currents:

Inductors and transformers constructed in the manner of FIGS. 17-21 offer superior performance with much less eddy current by segregating the metal lamination in two directions. This results because the embodiment shown has a core which is both thinner than conventional laminated cores by virtue of the fact (a) that the sheets of metal, from which the rings 320 are etched, can be much thinner using PCB or FLEX fabrication materials and (b) the individual insulated rings 320 may be made very narrow. Since eddy currents are proportional to the square of the segment cross section area, the embodiments dramatically reduce eddy currents compared to traditional methods of making transformers or inductors. For example, referring to traditional E core shown in FIG. 1, the metal laminates of this core cannot be separated in two directions because the strips would fall apart or simply not have mechanical integrity.

Surface Mount:

Windings formed in accordance with the embodiments of the present invention can be formed into surface mount leads without the need for separate lead-frame constructions, complicated pinning or end plating. Flat inductive devices constructed according to the present invention are very amendable to surface mount technology onto another surface such as a PCB or FLEX circuit.

Interconnection:

Because the etched transformers/inductors are manufactured employing identical processes used to manufacture PCB's or FPC's, the transformers can advantageously be an integral part of the power supply or circuit assembly thereby reducing the physical size, reducing the connections, and, in general, making the assembly more compact and smaller. Circuit components can be placed directly above or below the etched transformer, using the transformer area as the carrier for the balance of the circuitry so that the area of the entire circuit would be as small as the area of the transformer. For example, in a power supply application, the switching devices (such as diodes and FET semiconductors) can be mounted directly on top of the ferromagnetic plate thereby reducing the power supply circuit's length and size.

Magnetically Sound:

Cores constructed in accordance with the embodiments of the present invention offer a more efficient flux path with fewer losses than traditional transformers. These characteristics more closely resemble a toroid in design and function.

The magnetic flux path is shorter than comparable transformers using traditional cores such as E-Cores and PQ Cores.

Cell core embodiments, as shown in FIGS. 22-33C, have improved performance over conventional inductive devices. By placing the secondary windings through the same via holes as the primary windings, leakage inductance between the primary and secondary windings can be significantly reduced because the windings share the same flux. By placing the secondary windings through the same via holes as the primary windings, the proximity effect can be significantly reduced due to the counteracting effect of the primary and secondary windings and the separation between the primary and secondary wires. Since the ordinary processes employed to make PCB or Flex circuits can achieve the conductor's placement, advantageous winding patterns can be realized that reduce the current flow in individual conductors and lowers the resistance of the conductors.

Size:

The embodiments can be made smaller than conventional inductive devices because they do not require complicated pins or lead-frames. Surface pads on the top and bottom surfaces form the connection themselves and they can be surface mounted directly to PCB's thus reducing the footprint of the device and making more room for other components. Windings are in 2 planes therefore the windings of a ten-(10) layer planar transformer device, a typical application, can be reduced in overall height by a factor of five (5). The "core" is in one plane instead of a three-dimensional E core construction further reducing the overall height by a large factor. A very flat transformer or inductor can be built because the ferromagnetic slab is a thin flat surface. Very miniature inductive devices can be built by making the vias small and closely spaced within the thin ferromagnetic slab. Cell core arrangements as shown in FIGS. 22-33C can be advantageously used to realize elemental ferromagnetic cores comprising one via and the immediate ferromagnetic region surrounding it.

Cost:

The embodiments can be made from flex circuits and are much less expensive to manufacture than multi-layer planar windings. The conductors, necessary for a transformer or inductor, can be placed by automatic processing technology normally used to construct PCB or FLEX circuits. Also, eliminating the need for lead-frame's, potting, and cap gluing makes the device easier to manufacture.

Figure 15:
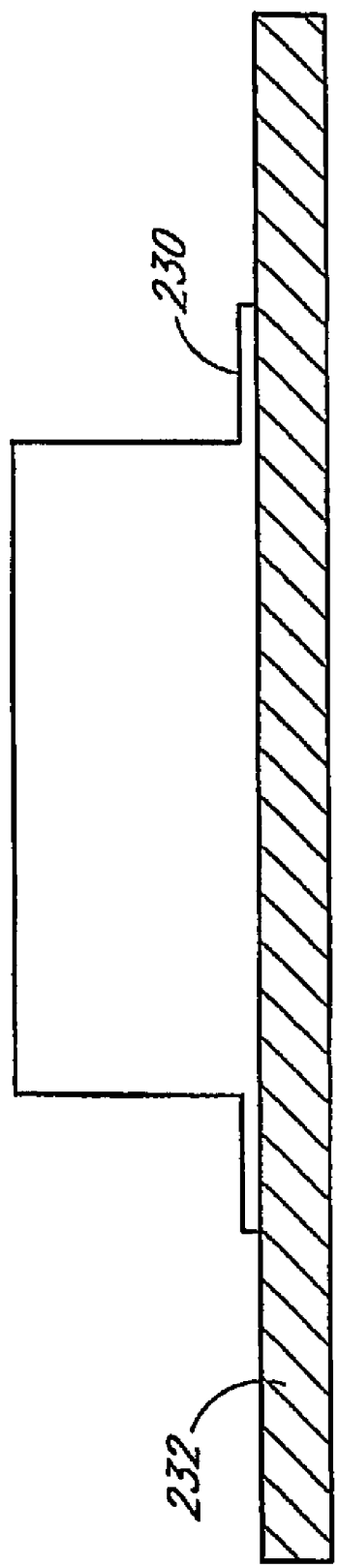
FIG. 15 illustrates the invention's heat dissipation characteristic by improved surface area to volume ratio.

Heat Removal:

One feature of inductors and transformers constructed in accordance with the embodiments of the present invention is that the heat generating windings of are not buried within an assembly or wound on top of each other as in traditional transformers nor are they stacked together as in planar transformers. Instead, the plated windings substantially reside on the top and bottom planes of the transformer or inductor device. This layout offers superior heat dissipation with no trapped heat buried within windings. The PCB can be advantageously attached to a heat sink, separated only by a thin solder mask typically only 0.005 inches thick, placing half of the windings in thermal contact with the heat sink, thereby offering a superior surface area to heat ratio. FIG. 15 shows one example of a large surface area 230 for excellent heat removal directly mounted to a heat sink 232 such as copper and aluminum.

Broad Application:

Many different possible turns-ratios may be realized with the embodiments of the current invention. Further, by stacking ferromagnetic slabs with via holes in alignment, a multidimensional device can be realized with a large number of equivalent winding turns.

While the invention has been described herein with reference to certain embodiments, these embodiments have been presented by way of example only, and not to limit the scope of the invention. Accordingly, the scope of the invention should be defined only in accordance with the claims that follow.

What is claimed is:

1. A cell core transformer having significantly reduced leakage inductance between the primary and secondary windings, said transformer having a substantially flat surface and circuit components associated with said transformer mounted directly onto said flat surface comprising:
   a. a slab of ferromagnetic magnetic material having a series of rows and columns of spaced via holes therethrough;
   b. a first primary conductor extending through a first one of said via holes formed in said slab of ferromagnetic material for carrying current to create a magnetic field within a portion of the ferromagnetic material proximally encompassing said via hole;
   c. a second primary conductor extending through a second one of said via holes formed in said slab of ferromagnetic material, said second via hole being adjacent to said first via hole;
   d. said first and second primary conductors coupled together so that the direction of current flowing in said first via is opposite to the direction of current flow in said second via whereby resulting flux generated between said first and second via has the same orientation where the two adjoining magnetic fields intersect;
   e. a first secondary conductor in, said slab of ferromagnetic material extending through the same via hole as said first primary conductor, whereby a voltage is induced in said first secondary conductor by the magnetic flux produced by current flowing in said first primary conductor;
   f. a second secondary conductor extending through the same via hole in said slab of ferromagnetic material as said second primary conductor, whereby a voltage is induced in said second secondary conductor by the magnetic flux produced by current flowing in said second primary conductor;
   g. said primary conductors coupled together and said secondary conductors coupled together to provide a desired turns ratio for said cell transformer; and
   h. electrical printed circuits formed on top and bottom surfaces of the slab having circuits in electrical contact with said first and second primary conductors and said first and second secondary conductors.

2. A cell core transformer having a substantially flat surface and circuit components associated with said transformer mounted directly onto said flat surface comprising:
   a. a slab of ferromagnetic magnetic material having a series of spaced via holes therethrough;
   b. a plurality of primary conductors respectively extending through said via holes so that current through said conductors creates a plurality of respective magnetic fields within a portion of the ferromagnetic material proximally encompassing said via holes;

c. a plurality of secondary conductors respectively extending through the same holes as via holes in which said primary conductors extend;

d. said primary conductors coupled together and said secondary conductors coupled together to provide a desired turns ratio for said cell transformer; and e. electrical printed circuits formed on top and bottom surfaces of the slab having circuits in electrical contract with said primary and secondary conductors.

3. The cell core transformer according to claim 2 wherein said plurality of primary conductors are coupled together so that current flow through any via is opposite to the current flow through its adjacent vias whereby the resulting flux generated between proximate vias has the same orientation where adjoining magnetic fields intersect.

4. The cell core transformer according to claim 2 wherein said plurality of secondary conductors are coupled in series.

5. The cell core transformer according to claim 2 wherein said plurality of secondary conductors are coupled in parallel.

6. The cell core transformer according to claim 2 having x+y secondary conductors, x number of said secondary conductors being coupled in series and y number of conductor are coupled in series, said series connected x conductors and said series connected y conductors being coupled together in parallel to provide a step-down transformer.

7. The cell core transformer according to claim 2 having b+c primary conductors and x+y secondary conductors, b number of said primary conductors being coupled in series, and said c number of said primary conductors being coupled in series;

said series connected b conductors and said series connected c being conductors coupled in parallel;

x number of secondary conductors being coupled in series, said y number of secondary conductors being coupled in series;

said series connected x conductors and said series connected y conductors coupled in parallel to provide a selected turns-ratio transformer.

8. A method for making a cell core transformer having an efficient flux path with reduced losses comprising:

forming a plurality of vias through a substantially planar ferromagnetic material, forming corresponding vias in a top PCB and a bottom PCB and one or more vias outside said ferromagnetic material;

forming primary conductors through each of said vias extending through said ferromagnetic material;

forming secondary conductors, insulated from said primary conductors, through each of said vias extending through said ferromagnetic material so that each via and the portion of the ferromagnetic material proximate thereto functions as a 1:1 turns ratio transformer;

forming PCB circuits in said top PCB and said bottom PCB to connect said primary and said secondary conductors in parallel or serial circuits determined by the desired turns ratio of the cell core transformer;

forming electrical conductors through one or more of said vias outside said ferromagnetic material to connect circuits on said top and bottom PCB's; and laminating said planar ferromagnetic material between said top PCB and said bottom PCB.

9. A method for making a cell core transformer having an efficient flux path with reduced losses comprising:

forming a plurality of vias through a substantially planar ferromagnetic material;

forming corresponding vias in flex circuits and one or more vias outside said ferromagnetic material;

forming a primary conductor through each of said vias extending through said ferromagnetic material;

forming secondary conductors, insulated from said primary conductors, through each of said vias extending through said ferromagnetic material so that each via and the portion of the ferromagnetic material proximate thereto functions as a 1:1 turns ratio transformer; and forming circuits in said flex material to connect said primary and said secondary conductor in parallel or serial circuits determined by the desired turns ratio of the cell core transformer.

10. A method for making a cell core transformer having an efficient flux path with reduced losses comprising:

forming a plurality of vias through a substantially planar ferromagnetic material;

forming a primary conductor through each of said vias extending through said ferromagnetic material;

forming secondary conductors, insulated from said primary conductors, through said vias extending through said ferromagnetic material so that each via and the portion of the ferromagnetic material proximate thereto operates as a 1:1 turning ratio transformer;

forming circuits to connect said primary and said secondary conductors in parallel or serial circuits determined by the desired turns ratio of the cell core transformer.

11. A cell core transformer having a substantially flat surface and circuit components associated with said transformer mounted directly on to said flat surface comprising:

a. a slab of magnetic material having a series of spaced holes therethrough;

b. a first conductor passing through one of said holes;

c. a second conductor passing through said holes, the second conductor being electrically insulated from the first conductor; and d. electrical printed circuits formed on top and bottom surfaces of the slab, the printed circuits in electrical contact with the first and second conductors.

12. A cell core transformer:

a. a member including a magnetic material, having a series of spaced holes through at least a portion of said magnetic material;

b. a first conductor passing through one of said holes;

c. a second conductor passing through said same holes, the second conductor being electrically insulated from the first conductor; and d. electrical printed circuits formed on top and bottom surfaces of the slab, the printed circuits in electrical contact with the first and second conductors.

* * * * *